(12) United States Patent
Sturcken et al.

(10) Patent No.: US 12,224,091 B2
(45) Date of Patent: Feb. 11, 2025

(54) FERROMAGNETIC-POLYMER COMPOSITE MATERIAL AND STRUCTURES COMPRISING SAME

(71) Applicant: Ferric Inc., New York, NY (US)

(72) Inventors: Noah Sturcken, New York, NY (US); Michael Lekas, Brooklyn, NY (US); Ryan Davies, New York, NY (US); Denis Shishkov, Brooklyn, NY (US); Matthew Cavallaro, New York, NY (US)

(73) Assignee: Ferric Inc., New York, NY (US)

( * ) Notice: Subject to any disclaimer, the term of this patent is extended or adjusted under 35 U.S.C. 154(b) by 715 days.

(21) Appl. No.: 17/377,886

(22) Filed: Jul. 16, 2021

(65) Prior Publication Data
US 2023/0027090 A1 Jan. 26, 2023

(51) Int. Cl.
| | |
|---|---|
| *H01F 1/03* | (2006.01) |
| *H01F 1/26* | (2006.01) |
| *H01F 10/32* | (2006.01) |
| *H01F 17/04* | (2006.01) |
| *H01F 27/24* | (2006.01) |

(Continued)

(52) U.S. Cl.
CPC ............ *H01F 1/0302* (2013.01); *H01F 1/26* (2013.01); *H01F 10/3222* (2013.01); *H01F 10/3231* (2013.01); *H01F 27/24* (2013.01); *H01F 27/28* (2013.01); *H01F 41/0246* (2013.01); *H01F 41/16* (2013.01); *H01L 23/5227* (2013.01); *H01F 2017/048* (2013.01); *H01F 41/00* (2013.01)

(58) Field of Classification Search
None
See application file for complete search history.

(56) References Cited

U.S. PATENT DOCUMENTS

| | | |
|---|---|---|
| 1,553,983 A | 9/1925 | Casper |
| 2,931,966 A | 4/1960 | Rockey |

(Continued)

FOREIGN PATENT DOCUMENTS

| | | |
|---|---|---|
| CN | 106852099 B | 1/2020 |
| DE | 102017101966 A1 | 8/2018 |

(Continued)

OTHER PUBLICATIONS

Soft magnetic materials NPL article (Year: 2002).*

(Continued)

*Primary Examiner* — Kevin M Bernatz
(74) *Attorney, Agent, or Firm* — Intrinsic Law Corp.

(57) ABSTRACT

A ferromagnetic-polymer composite material comprises a polymer and a plurality of ferromagnetic film platelets disposed in the polymer. Each ferromagnetic film platelet comprises first and second insulator layers and a ferromagnetic layer disposed between the first and second insulator layers. The ferromagnetic layer can be magnetically anisotropic in which a hard axis of magnetization is aligned parallel to a plane that passes through and parallel to an interface between the first insulator layer and the ferromagnetic layer. The easy and/or hard axes of magnetization in the ferromagnetic film platelets can be aligned. An inductor can have a core formed of the ferromagnetic-polymer composite material.

26 Claims, 26 Drawing Sheets

(51) Int. Cl.
*H01F 27/28* (2006.01)
*H01F 41/02* (2006.01)
*H01F 41/16* (2006.01)
*H01L 23/522* (2006.01)
*H01F 41/00* (2006.01)

(56) References Cited

U.S. PATENT DOCUMENTS

| | | | |
|---|---|---|---|
| 3,614,554 | A | 10/1971 | Shield et al. |
| 4,103,315 | A | 7/1978 | Hempstead et al. |
| 4,236,946 | A | 12/1980 | Aboaf et al. |
| 5,070,317 | A | 12/1991 | Bhagat |
| 5,225,971 | A | 7/1993 | Spreen |
| 5,238,507 | A | 8/1993 | Kugimiya et al. |
| 5,319,343 | A | 6/1994 | Jeffries |
| 5,399,372 | A | 3/1995 | Grimes et al. |
| 5,583,474 | A | 12/1996 | Mizoguchi et al. |
| 5,635,892 | A | 6/1997 | Ashby et al. |
| 5,831,431 | A | 11/1998 | Gottfried-Gottfried et al. |
| 6,362,986 | B1 | 3/2002 | Schultz et al. |
| 6,542,060 | B2 | 4/2003 | Fedeli |
| 6,542,379 | B1 | 4/2003 | Lauffer et al. |
| 6,856,226 | B2 | 2/2005 | Gardner |
| 6,940,384 | B2 | 9/2005 | Hooey et al. |
| 7,636,242 | B2 | 12/2009 | Hazucha et al. |
| 7,719,084 | B2 | 5/2010 | Gardner et al. |
| 7,867,787 | B2 | 1/2011 | Gardner et al. |
| 8,108,984 | B2 | 2/2012 | Gardner et al. |
| 8,558,344 | B2 | 10/2013 | Chen |
| 9,647,053 | B2 | 5/2017 | Sturcken et al. |
| 10,002,828 | B2 | 6/2018 | Sturcken et al. |
| 10,354,950 | B2 | 7/2019 | Sturcken et al. |
| 2002/0060621 | A1 | 5/2002 | Duffy et al. |
| 2003/0070282 | A1 | 4/2003 | Hiatt et al. |
| 2004/0135661 | A1 | 7/2004 | Haugs et al. |
| 2004/0166308 | A1* | 8/2004 | Raksha ............... C09C 1/0024 428/329 |
| 2005/0088269 | A1 | 4/2005 | Hatano |
| 2006/0197510 | A1 | 9/2006 | Chandrasekaran |
| 2006/0263727 | A1 | 11/2006 | Lee et al. |
| 2006/0273418 | A1 | 12/2006 | Chung et al. |
| 2007/0218273 | A1 | 9/2007 | Ikeda |
| 2007/0290362 | A1 | 12/2007 | Hsu et al. |
| 2009/0175014 | A1 | 7/2009 | Zeng et al. |
| 2009/0188104 | A1 | 7/2009 | Ching et al. |
| 2009/0324982 | A1 | 12/2009 | Aramaki et al. |
| 2011/0151588 | A1 | 6/2011 | Ashdown et al. |
| 2011/0279214 | A1 | 11/2011 | Lee et al. |
| 2013/0056847 | A1 | 3/2013 | Chen |
| 2013/0099762 | A1 | 4/2013 | Terrovitis |
| 2013/0228716 | A1* | 9/2013 | Suetsuna ............ H01F 1/15333 427/127 |
| 2014/0027879 | A1 | 1/2014 | Weyers et al. |
| 2014/0209691 | A1 | 7/2014 | Finn et al. |
| 2014/0240074 | A1 | 8/2014 | Qui et al. |
| 2014/0252548 | A1 | 9/2014 | Yen et al. |
| 2014/0266541 | A1 | 9/2014 | Sakamoto et al. |
| 2015/0137776 | A1 | 5/2015 | Thomas et al. |
| 2015/0243881 | A1 | 8/2015 | Sankman et al. |
| 2015/0303583 | A1* | 10/2015 | Takahashi ............... H01Q 17/00 342/1 |
| 2015/0349424 | A1 | 12/2015 | Hur et al. |
| 2016/0086717 | A1* | 3/2016 | Harada ................. C22F 1/10 148/303 |
| 2016/0189852 | A1 | 6/2016 | Jeon et al. |
| 2016/0233153 | A1 | 8/2016 | Kidwell, Jr. et al. |
| 2017/0076860 | A1* | 3/2017 | Deligianni ......... H01F 10/3204 |
| 2017/0250133 | A1 | 8/2017 | Sturcken et al. |
| 2017/0256353 | A1 | 9/2017 | Park et al. |
| 2020/0082963 | A1* | 3/2020 | Suetsuna ............ H01F 1/14741 |
| 2020/0152364 | A1* | 5/2020 | Sturcken .................. H01F 7/14 |
| 2022/0085669 | A1* | 3/2022 | Kinouchi ................ H02K 1/02 |

FOREIGN PATENT DOCUMENTS

| | | |
|---|---|---|
| FR | 2817622 A | 6/2002 |
| JP | 05082736 A1 | 4/1993 |
| JP | 05291063 A | 11/1993 |
| JP | H09162354 A | 6/1997 |
| TW | 200417759 A | 7/2004 |
| WO | 2008143635 A1 | 11/2008 |
| WO | 2021049995 A1 | 3/2021 |
| WO | 2021140156 A1 | 7/2021 |

OTHER PUBLICATIONS

Office Action from Taiwan Intellectual Property Office for Taiwanese Application No. 111125612, dated Feb. 17, 2023.
International Search Report for PCT Application No. PCT/US2022/071251, dated Jan. 5, 2023.
ISA, "Invitation to Pay Additional Fees and, Where Applicable, Protest Fee", PCT/US2022/071251, Nov. 30, 2022.
International Search Report for PCT Application No. PCT/US2021/041967, dated Apr. 19, 2022.
N. Sturcken et al., "Design of Coupled Power Inductors with Crossed Anisotropy Magnetic Core for Integrated Power Conversion", 2012, p. 417-423, IEEE.
D. W. Lee et al., "Design and Fabrication of Integrated Solenoid Inductors with Magnetic Cores", Electronic Components and Technology Conference, 2008, p. 701-705, IEEE.
N. Sturcken et al., "A 2.5D Integrated Voltage Regulator Using Coupled Magnetic-Core Inductors on Silicon Interposer Delivering 10.8A/mm", IEEE International Solid-State Circuits Conference, Feb. 22, 2012, p. 3-5, Session 23, IEEE.
N. A. Sturcken, "Integrated Voltage Regulators with Thin-Film Magnetic Power Inductors", 2013, Columbia University.

* cited by examiner

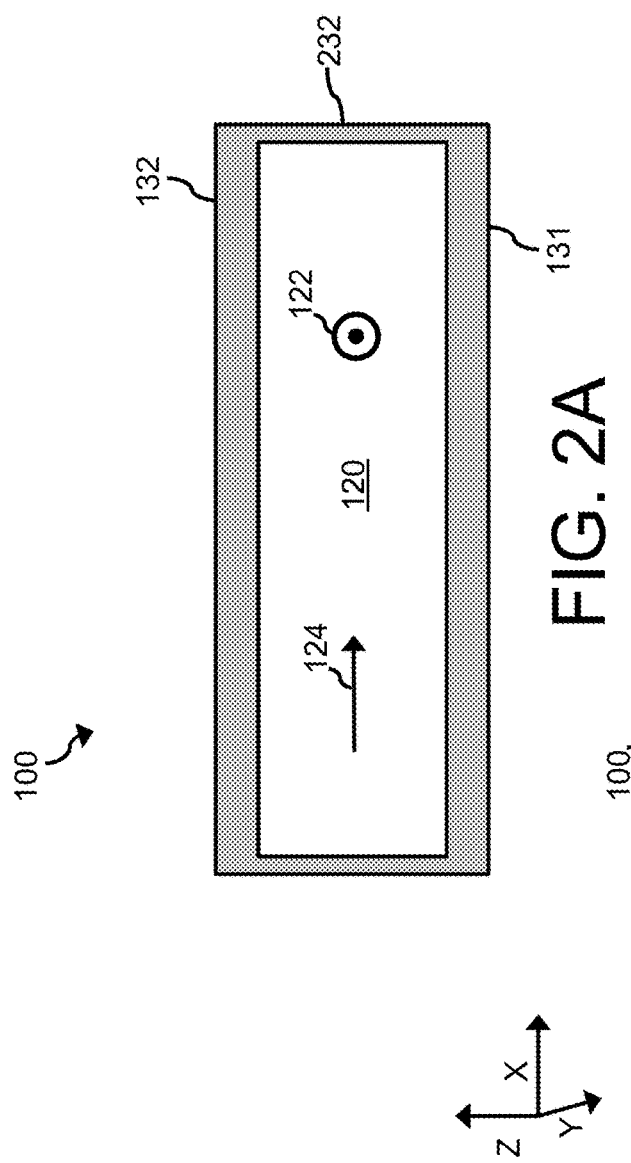
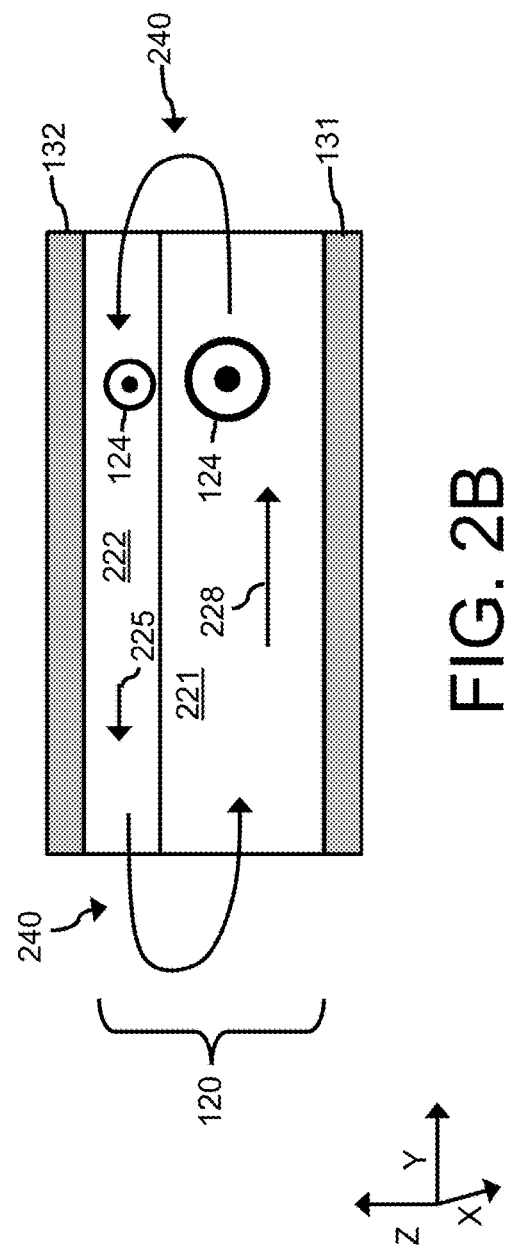

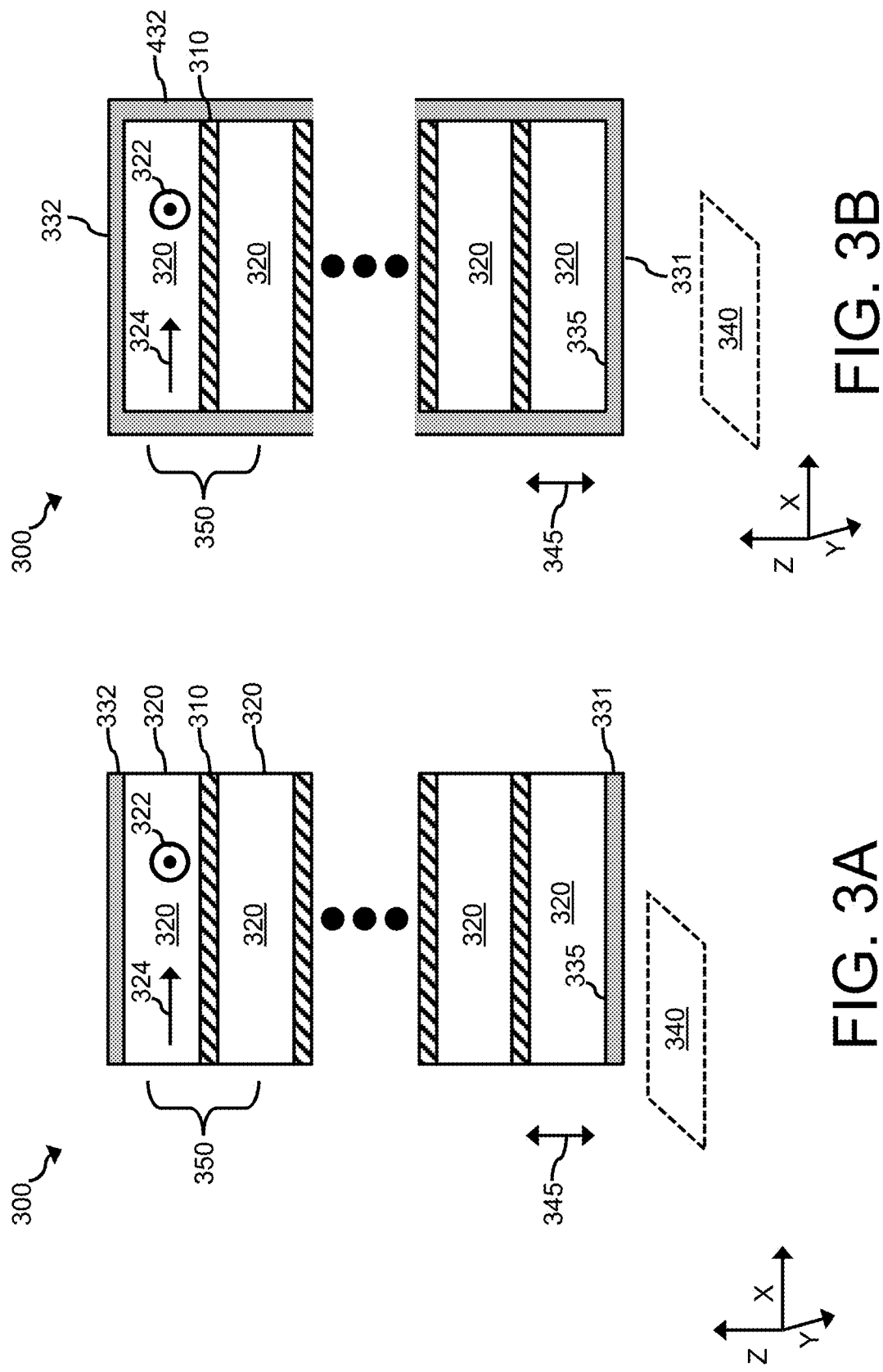

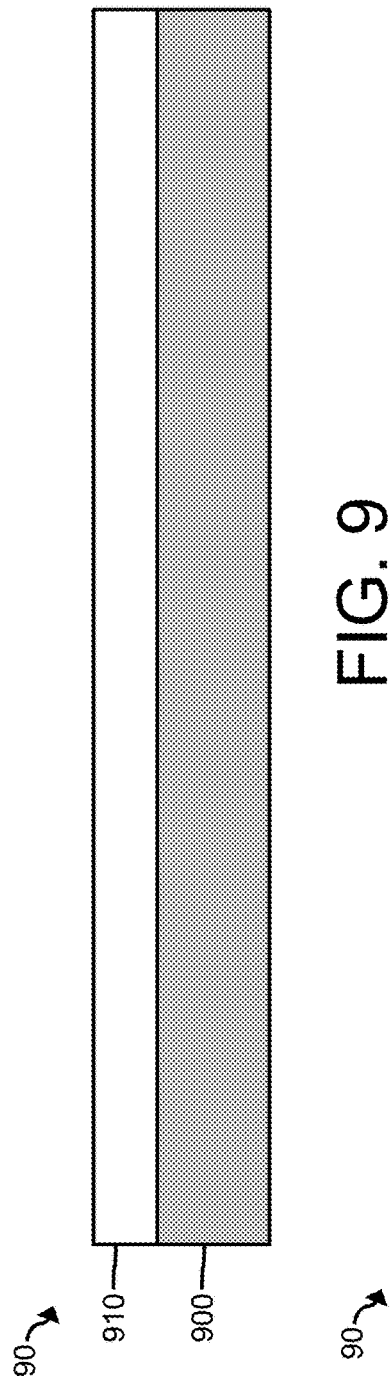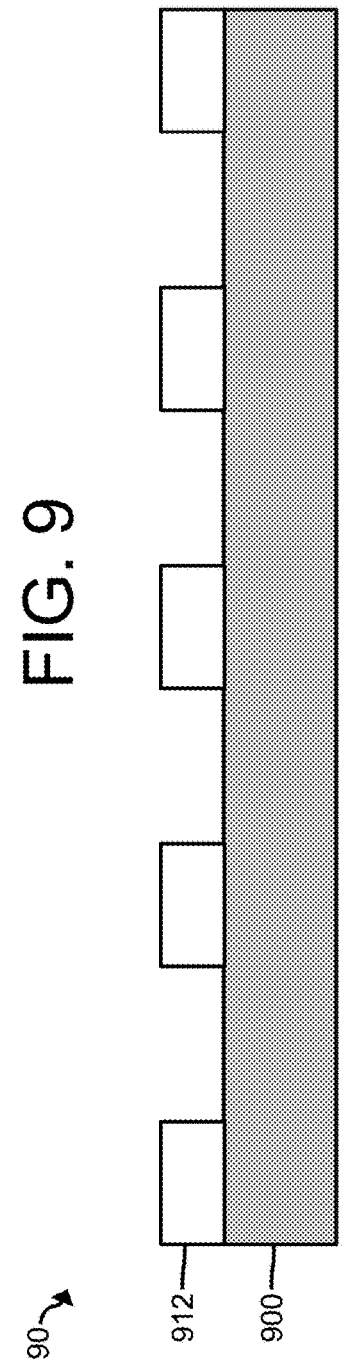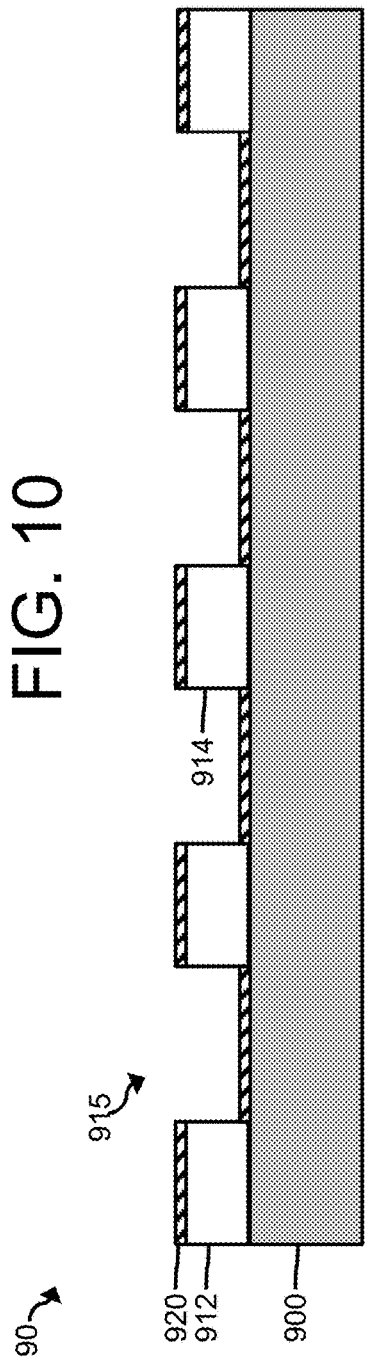

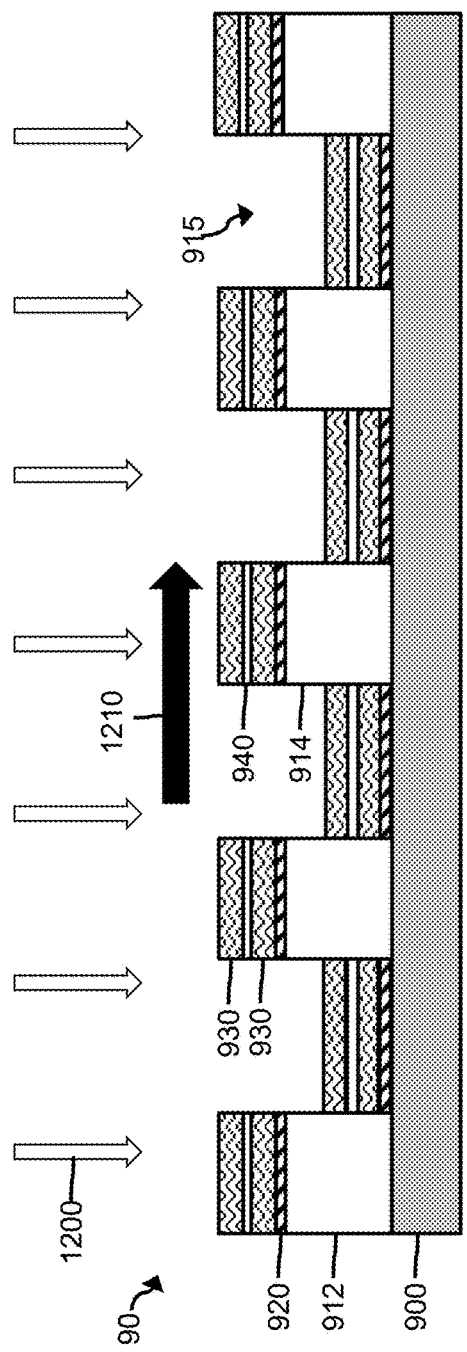
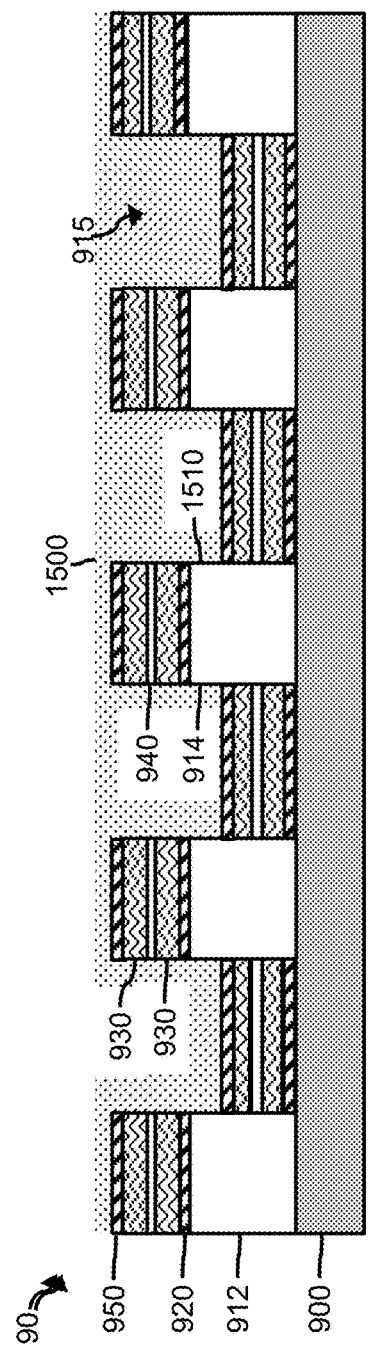
FIG. 14
FIG. 15

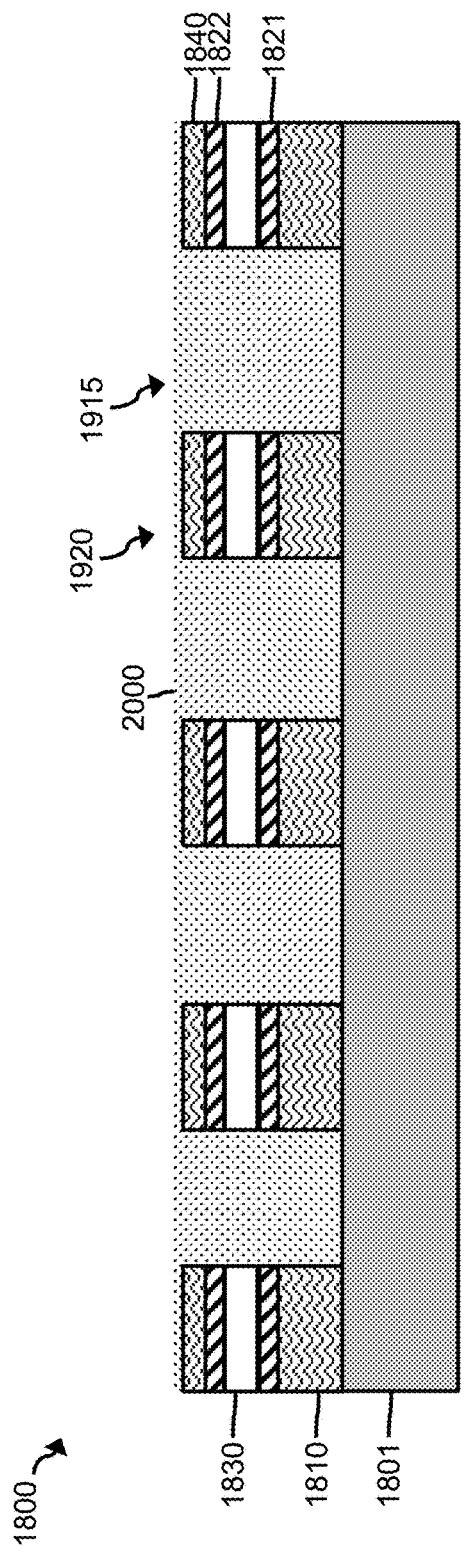
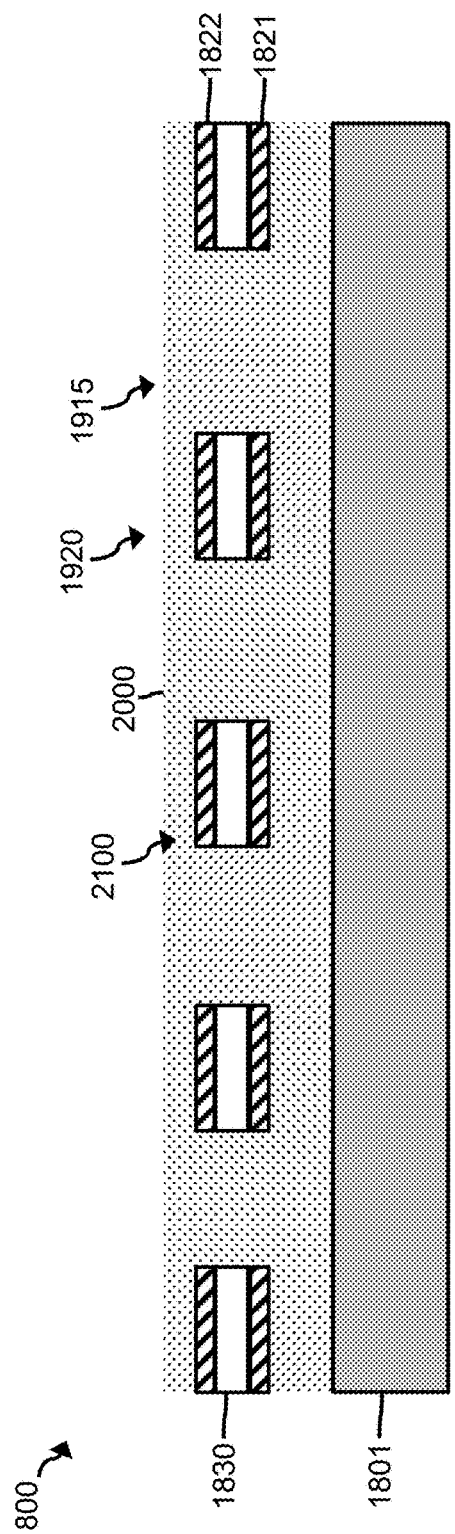

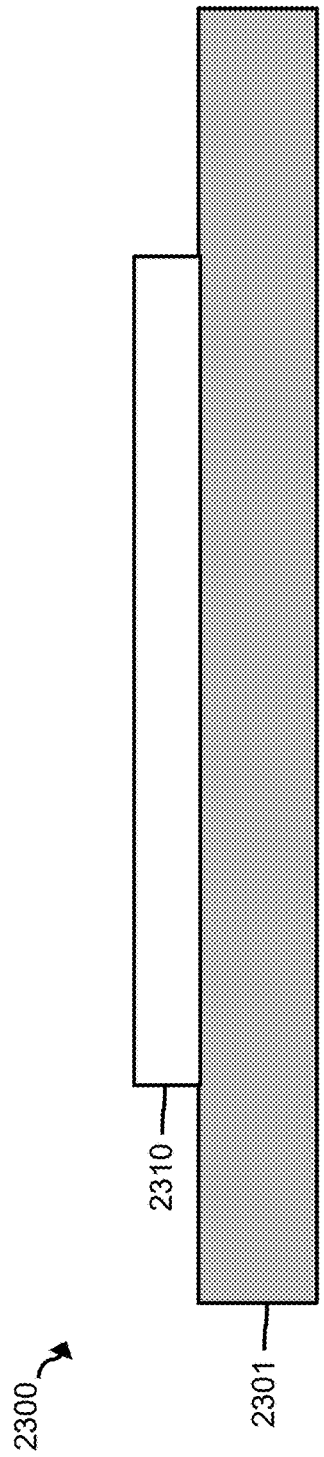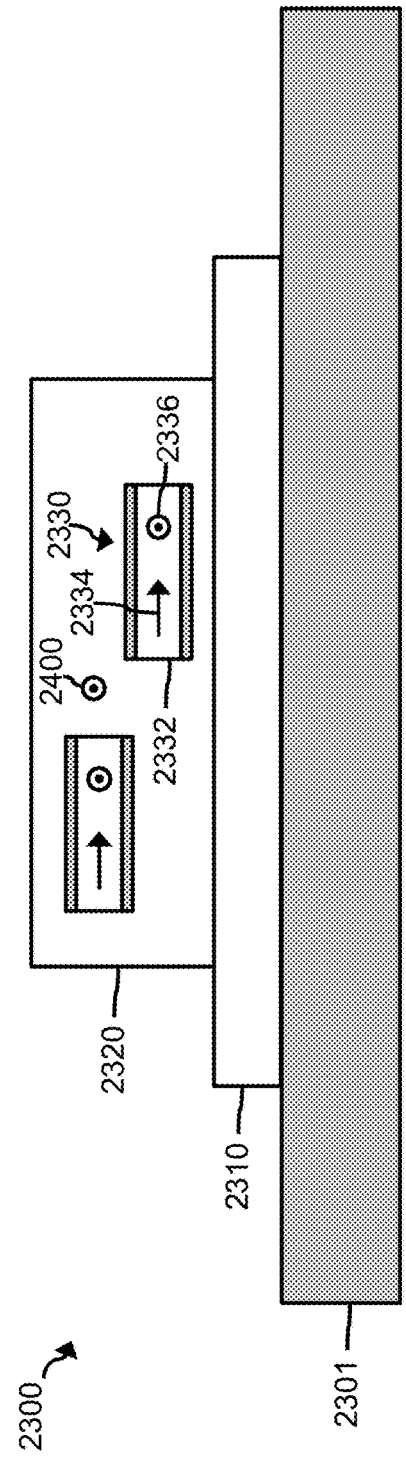

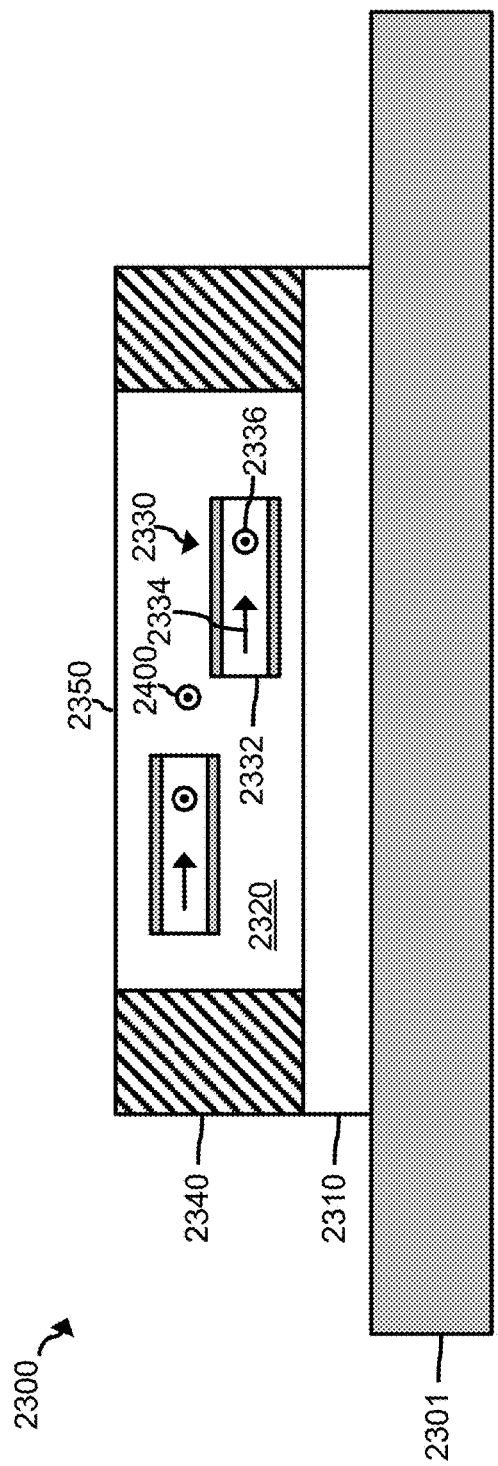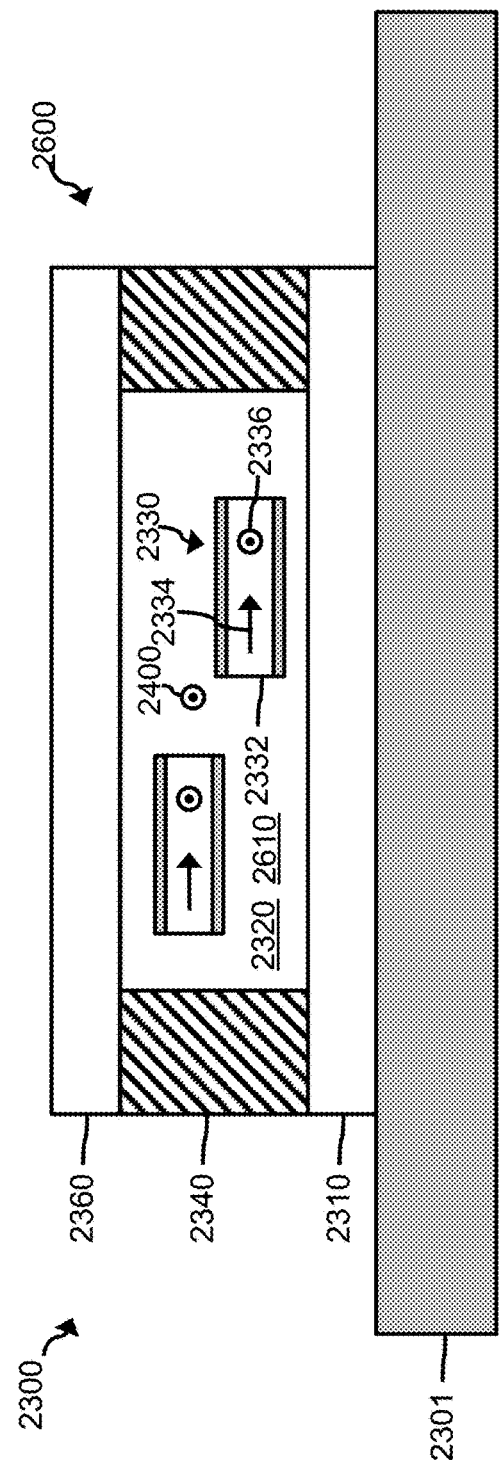

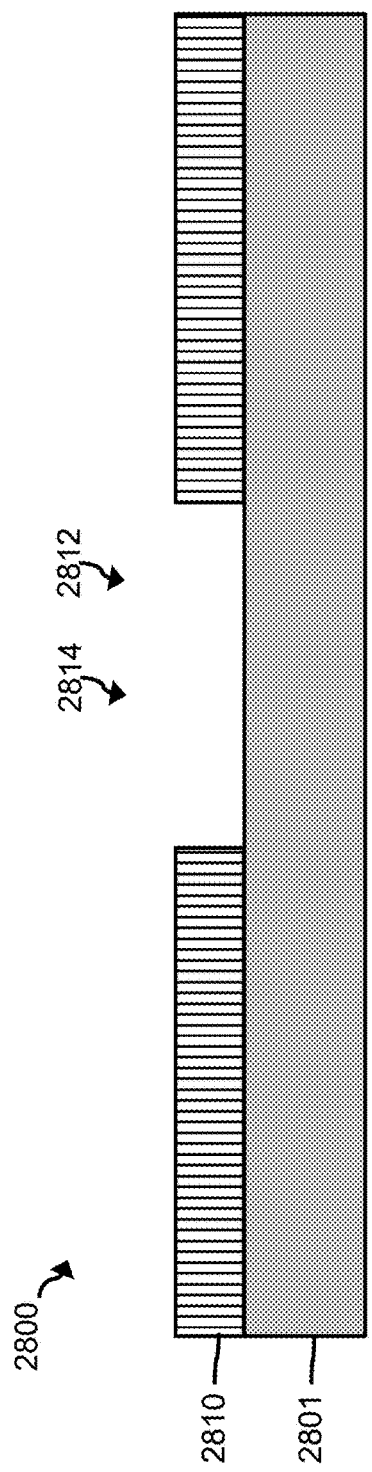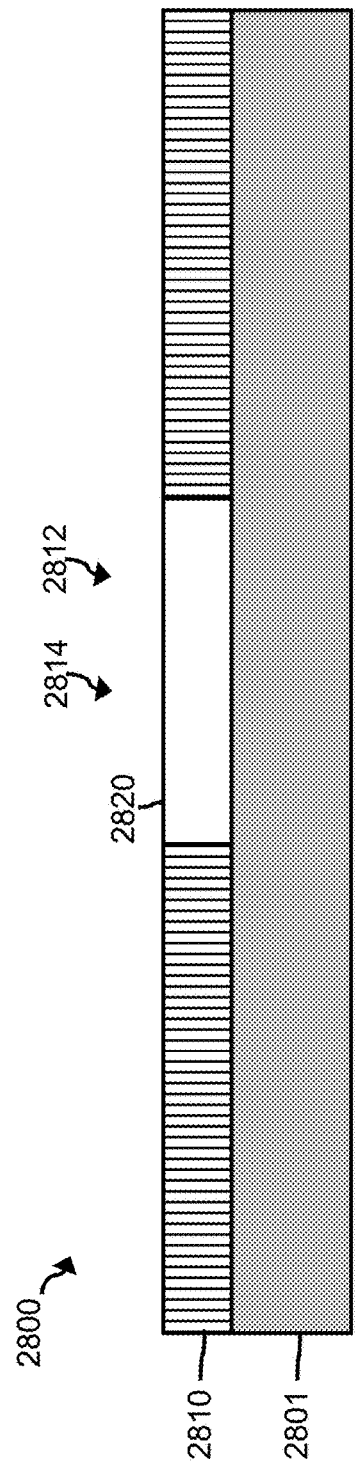

FERROMAGNETIC-POLYMER COMPOSITE MATERIAL AND STRUCTURES COMPRISING SAME

TECHNICAL FIELD

This application relates generally to microelectronics fabrication and materials for microelectronics fabrication.

BACKGROUND

The increase in computing power and spatial densities in semiconductor based devices and energy efficiency of the same allow for ever more efficient and small microelectronic sensors, processors and other machines. These have found wide use in mobile and wireless applications and other industrial, military, medical and consumer products.

Even though computing energy efficiency is improving over time, the total amount of energy used by computers of all types is on the rise. Hence, there is a need for even greater energy efficiency.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a ferromagnetic-polymer composite material comprising: a polymer; and a plurality of ferromagnetic film platelets disposed in the polymer, each ferromagnetic film platelet comprising: first and second insulator layers; and a ferromagnetic layer disposed between the first and second insulator layers.

In one or more embodiments, in each ferromagnetic film platelet the ferromagnetic layer is in direct physical contact with the first and second insulator layers. In one or more embodiments, in each ferromagnetic platelet: a plane passes through and parallel to an interface between the first insulator layer and the ferromagnetic layer, and the ferromagnetic layer has a magnetic anisotropy in which a hard axis of magnetization of the ferromagnetic layer is aligned parallel to the plane. In one or more embodiments, the hard axes of magnetization in the ferromagnetic film platelets are aligned.

In one or more embodiments, in each ferromagnetic film platelet the ferromagnetic layer comprises: a hard ferromagnetic layer having a magnetic coercivity of at least about 100 Oe; and a soft ferromagnetic layer having a magnetic coercivity of less than or equal to about 1 Oe, wherein the hard and soft ferromagnetic layers are magnetically coupled. In one or more embodiments, in each ferromagnetic film platelet the hard ferromagnetic layer has a remnant magnetization of at least 0.1 T. In one or more embodiments, in each ferromagnetic platelet: a plane passes through and parallel to an interface between the first insulator layer and the ferromagnetic layer, the hard ferromagnetic layer has a magnetic anisotropy in which an easy axis of magnetization of the hard ferromagnetic layer is aligned parallel to the plane, the soft ferromagnetic layer has a magnetic anisotropy in which an easy axis of magnetization of the soft ferromagnetic layer is aligned parallel to the plane, and the easy axis of magnetization of the soft ferromagnetic layer is parallel to the easy axis of magnetization of the hard ferromagnetic layer.

In one or more embodiments, in each ferromagnetic film platelet the ferromagnetic layer comprises a soft ferromagnetic layer having a magnetic coercivity of less than or equal to about 1 Oe. In one or more embodiments, the electrical insulators comprise a compound that includes (a) oxygen and/or nitrogen and (b) aluminum, chromium, cobalt, silicon, tantalum, titanium, silicon, and/or zirconium. In one or more embodiments, the electrical insulators function as a diffusion barrier between the ferromagnetic layer and the polymer.

In one or more embodiments, a plane passes through and parallel to an interface between the first insulator layer and the ferromagnetic layer, the ferromagnetic layer has a thickness in a range of about 100 nm to about 10 μm, the thickness measured along an axis orthogonal to the plane. In one or more embodiments, a plane passes through and parallel to an interface between the first insulator layer and the ferromagnetic layer, each film platelet has a thickness in a range of about 100 nm to about 10 μm, the thickness measured along an axis orthogonal to the plane, each film platelet has a width in a range of about 1 μm to about 100 μm, the width measured along a second axis that is orthogonal to the first axis, and each film platelet has a length in a range of about 1 μm to about 100 μm, the length measured along a third axis that is orthogonal to the first and second axes. In one or more embodiments, each film platelet has a top-view shape of an ellipse or a disk, the cross-sectional shape in a cross section parallel to the plane.

In one or more embodiments, in each ferromagnetic platelet: the ferromagnetic layer is a first ferromagnetic layer, a plurality of ferromagnetic layers are disposed between the first and second insulator layers, the plurality of ferromagnetic layers including the first ferromagnetic layer, the plurality of ferromagnetic layers further including pairs of neighboring ferromagnetic layers, and a spacer layer is disposed between each pair of neighboring ferromagnetic layers. In one or more embodiments, each spacer layer functions as an electrical insulation layer. In one or more embodiments, a plane passes through an interface between the first insulator layer and an adjacent ferromagnetic layer, each ferromagnetic layer has a magnetic anisotropy in which a hard axis of magnetization of the ferromagnetic layer is aligned parallel to the plane, and the hard axes of magnetization are aligned. In one or more embodiments, the hard axes of magnetization in the ferromagnetic film platelets are aligned.

In one or more embodiments, the material comprises a range of about 40% to about 99% by volume of the ferromagnetic film platelets about a range of about 1% to about 60% by volume of the polymer.

Another aspect of the invention is directed to an inductor comprising a core comprising or consisting of a ferromagnetic-polymer composite material that comprises: a polymer; and a plurality of ferromagnetic film platelets disposed in the polymer, each ferromagnetic film platelet comprising: first and second insulator layers; and a ferromagnetic layer disposed between the first and second insulator layers. The inductor further comprises a conductive winding that turns around in a spiral manner on an outside of the core.

Yet another aspect of the invention is directed to a structure comprising: a semiconductor integrated circuit comprising a multilevel wiring network formed on a substrate, wherein the inductor is integrated into the multilevel wiring network.

Another aspect of the invention is directed to a method of manufacturing a ferromagnetic-polymer composite material, comprising: combining a plurality of ferromagnetic film platelets and a liquid polymer, wherein each ferromagnetic film platelet comprises: first and second insulator layers; and a ferromagnetic layer disposed between the first and second insulator layers; mixing the ferromagnetic film platelets and the liquid polymer to form a liquid ferromagnetic-polymer composite material; and curing the liquid ferromagnetic-polymer composite material to form a solid ferromagnetic-polymer composite material.

In one or more embodiments, the method further comprises: depositing the first insulator layer on a patterned photo-imageable polymer layer, the patterned photo-imageable polymer layer disposed on or over a substrate; depositing the ferromagnetic layer on the first insulator layer; depositing the second insulator layer on the ferromagnetic layer to form the ferromagnetic film platelets; and exposing the patterned photo-imageable polymer layer to a solvent to release the ferromagnetic film platelets from the patterned photo-imageable polymer.

In one or more embodiments, the ferromagnetic layer in each ferromagnetic film platelet has a magnetic anisotropy in which a hard axis of magnetization of the ferromagnetic layer is aligned parallel to a respective plane, and the method further comprises: applying a magnetic field during the curing step, the magnetic field passing through the liquid ferromagnetic-polymer composite material along an axis; and aligning the hard axes of magnetization of the ferromagnetic film platelets along the axis.

In one or more embodiments, the method further comprises: depositing a first photo-imageable polymer layer on or over a substrate; depositing the first insulator layer on the first photo-imageable polymer layer; depositing the ferromagnetic layer on the first insulator layer; depositing the second insulator layer on the ferromagnetic layer; depositing a second photo-imageable polymer layer on the second insulator layer; defining a pattern in the second photo-imageable polymer layer; etching the first photo-imageable polymer layer, the first insulator layer, the ferromagnetic layer, and the second insulator layer according to the pattern to define the ferromagnetic film platelets, the ferromagnetic film platelets disposed between patterned first and second photo-imageable polymer layers; and exposing the patterned first and second photo-imageable polymer layers to a solvent to release the ferromagnetic film platelets from the patterned first and second photo-imageable polymer layers.

In one or more embodiments, the method further comprises dissolving the patterned first and second photo-imageable polymer layers in the solvent to release the ferromagnetic film platelets from the patterned photo-imageable polymer. In one or more embodiments, the method further comprises filling a mold with the ferromagnetic-polymer composite material prior to the curing step.

BRIEF DESCRIPTION OF THE DRAWINGS

For a fuller understanding of the nature and advantages of the concepts disclosed herein, reference is made to the detailed description of preferred embodiments and the accompanying drawings.

FIGS. 2A and 2B are example cross-sectional views of a ferromagnetic film platelet according to alternative embodiments.

FIGS. 3A, 3B, and 3C are example cross-sectional views of a ferromagnetic film platelet according to alternative embodiments.

FIGS. 9-16 are cross-sectional views of a structure to illustrate the steps of the flow chart illustrated in FIG. 8.

FIGS. 18-21 are cross-sectional views of a structure to illustrate certain steps of the flow chart illustrated in FIG. 17.

FIGS. 23-26 are cross-sectional views of a structure to illustrate the steps of the flow chart illustrated in FIG. 22.

FIGS. 28-30 are cross-sectional views of a structure to illustrate certain steps of the flow chart illustrated in FIG. 27.

DETAILED DESCRIPTION

A ferromagnetic polymer composite material includes a polymer and a plurality of ferromagnetic film platelets disposed in the polymer. Each ferromagnetic film platelet includes at least first and second insulator layers and a ferromagnetic layer disposed between the first and second insulator layers. The ferromagnetic layer can have a magnetic anisotropy in which a hard axis of magnetization of the ferromagnetic layer is aligned parallel to a plane that passes through and is parallel to an interface between the first insulator layer and the ferromagnetic layer. The hard axes of magnetization in the ferromagnetic film platelets can also be aligned.

The ferromagnetic polymer composite material can be used as the core for an electronic device such as an inductor, a transformer, a filter, and/or an antenna.

Figure 1A:
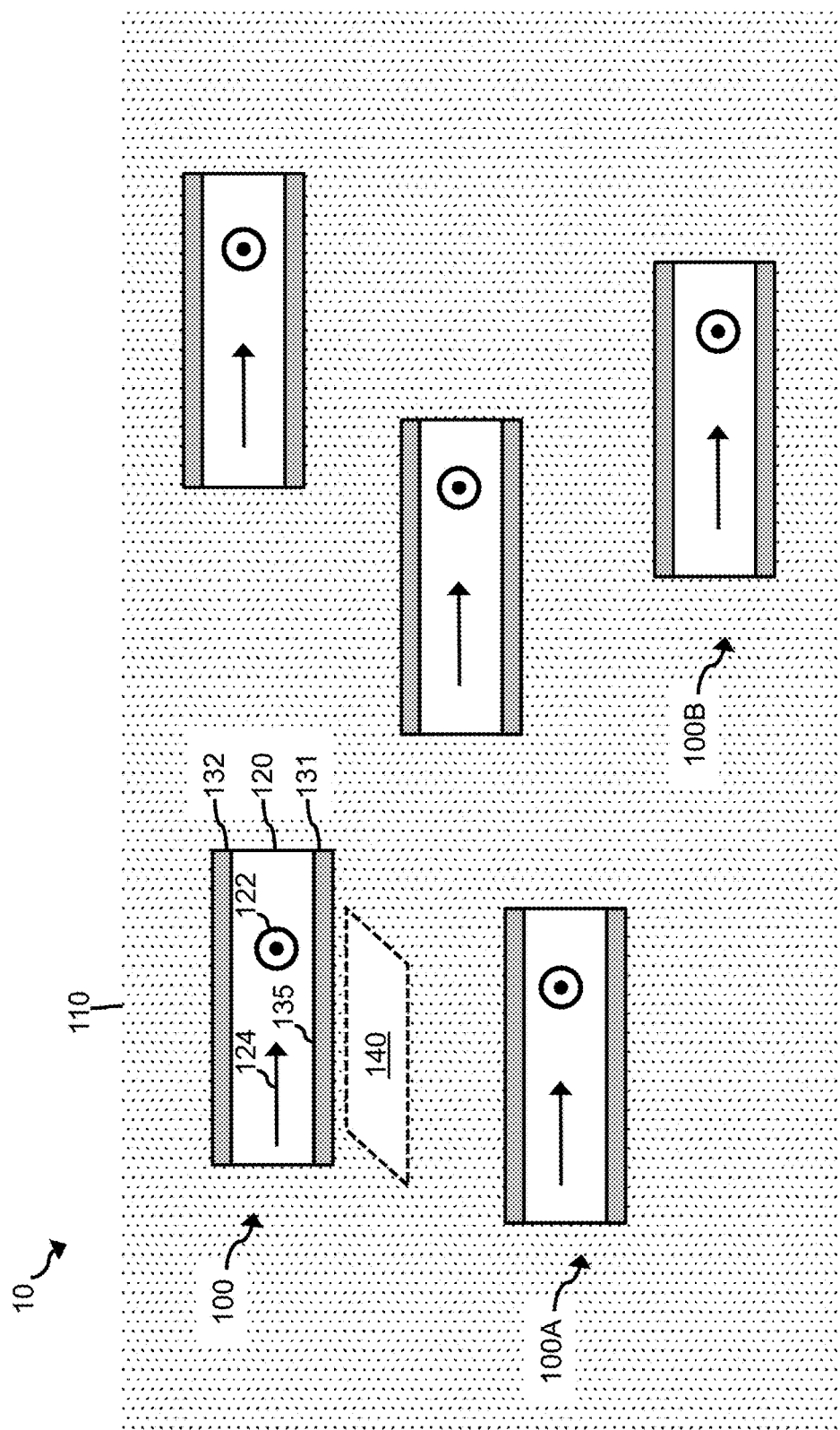
FIG. 1A is an example cross-sectional view of a ferromagnetic polymer composite material according to an embodiment.

FIG. 1A is an example cross-sectional view of a ferromagnetic polymer composite material 10 according to an embodiment. The material 10 includes a plurality of ferromagnetic film platelets 100 disposed in a polymer 110. The ferromagnetic film platelets 100 can be dispersed, distributed, embedded, and/or mixed in the polymer 110.

Each platelet 100 includes a ferromagnetic layer 120 disposed between first and second insulator layers 131, 132. The ferromagnetic layer 120 can include cobalt, nickel, and/or iron, or a compound or alloy comprising cobalt, nickel, and/or iron. In one example, the ferromagnetic layer 120 comprises a soft ferromagnetic material such as $Co_xZr_yTa_{1-x-y}$ (CZT) with x and y being about 0.915 and 0.04, respectively. In another example, the soft ferromagnetic material can comprise CoZrTa—B (or CoZrTaB), CoNiFe, NiFe, CoFe, and/or CoFeB, or alloys that include any of the foregoing compounds. The soft ferromagnetic material can have a magnetic coercivity of less than or equal to about 1 Oe.

In another example, the ferromagnetic layer 120 comprises a hard ferromagnetic material such as AlNiCo, NdFeB, SmCo, ferrite alloys of $Fe_xO_y$ that include one or more metals such as Ni, Co, Sr, and/or Ba (e.g., cobalt ferrite ($CoFe_2O_4$) and/or nickel ferrite ($NiFe_2O_4$)), or alloys that include any of the foregoing materials. The hard ferromagnetic material can have a remnant magnetization of at least about 0.1 T and/or a magnetic coercivity of at least about 100 Oe.

The ferromagnetic layer 120 can be magnetically anisotropic such that its easy axis of magnetization 122 is parallel to the Y axis and its hard axis of magnetization 124 is parallel to the X axis. Alternatively, the easy axis of magnetization 122 can be parallel to the X axis and the hard axis of magnetization 124 can be parallel to the Y axis. The easy and hard axes 122, 124 can be permanently or semi-permanently set. The easy and hard axes 122, 124 are orthogonal to each other within the x-y plane. In addition, the easy and hard axes 122, 124 are parallel to a plane 140 that passes through and is parallel to the interface 135 between the ferromagnetic layer 120 and the first insulator layer 131. The plane 140 is also orthogonal to the Z axis. The easy and/or hard axes 122, 124 of each platelet 100 can be aligned or substantially aligned (e.g., within about 5°) with the respective easy and/or hard axes 122, 124 of the other platelets 100. For example, the easy and/or hard axes of magnetization 122, 124 in a first platelet 100A are aligned or substantially aligned (e.g., within about 5°) with the easy and/or hard axes of magnetization 122, 124 in the other platelets 100, such as the easy and/or hard axes of magnetization 122, 124 in a second platelet 100B.

The first and second insulator layers 131, 132 comprise an electrically-insulating material. For example, the first and second insulator layers 131, 132 can comprise (a) aluminum, chromium, cobalt, silicon, tantalum, titanium, and/or zirconium, or (b) a compound of (1) aluminum, cobalt, chromium, silicon, tantalum, titanium, and/or zirconium and (2) oxygen and/or nitrogen. For example, the insulator layers 131, 132 can comprise silicon dioxide ($SiO_2$), aluminum oxide ($Al_xO_y$), chromium oxide ($Cr_xO_y$), cobalt oxide ($Co_xO_y$), tantalum oxide ($Ta_xO_y$), titanium oxide ($Ti_xO_y$), silicon nitride ($Si_xN_y$), aluminum nitride ($Al_xN_y$), tantalum nitride ($Ta_xN_y$), or a combination of two or more of the foregoing. The first and second insulator layers 131, 132 can comprise the same material or different materials.

In some embodiments, the first and second insulator layers 131, 132 can function as diffusion barriers between the ferromagnetic layer 120 and the polymer 110. For example, the first and second insulator layers 131, 132 can prevent the ferromagnetic material in the ferromagnetic layer 120 from diffusing into the polymer 110. Additionally or alternatively, the first and second insulator layers 131, 132 can prevent the polymer 110 or other contaminants from diffusing into the ferromagnetic layer 120.

The ferromagnetic layer 120 and the first and second insulator layers 131, 132 have a respective thickness that can be measured along or parallel to the Z axis, which is orthogonal to the plane 140. When a platelet 100 has a different orientation with respect to a coordinate system, the thickness of the ferromagnetic layer 120 and the first and second insulator layers 131, 132 can be measured with respect to another axis that is orthogonal to the plane 140. The thickness of the ferromagnetic layer 120 can be in a range of about 100 nm to about 10 µm, including about 500 nm, about 1 µm, about 3 µm, about 5 µm, about 7 µm, about 9 µm, and any thickness or thickness range between any two of the foregoing thicknesses. The thickness of each insulator layer 131, 132 can be in a range of about 2 nm to about 200 nm, including about 10 nm, about 25 nm, about 50 nm, about 75 nm, about 100 nm, about 125 nm, about 150 nm, about 175 nm, and any thickness or thickness range between any two of the foregoing thicknesses. The first and second insulator layers 131, 132 can have the same or different thicknesses. As used herein, "about" means plus or minus 10% of the relevant value. Some of the material in second insulator layer 132 may form on the side of the platelet 100 during fabrication and can provide electrical insulation and a diffusion barrier along the side of the platelet 100. For example, the second insulator layer 132 can form sidewalls 232 on some or all of the sides of the ferromagnetic layer 120, as illustrated in FIG. 2A.

The overall or total thickness of each platelet 100 can be in a range of about 104 nm to about 10.4 µm. The thickness of each platelet 100 can be measured along or parallel to the Z axis or another axis that is orthogonal to the plane 140.

The length and width of each platelet 100 can be measured along or parallel to the X axis and the Y axis, respectively. When a platelet 100 has a different orientation with respect to a coordinate system, the length and width can be measured with respect to first and second axes that are parallel to the plane 140 where the first and second axes are orthogonal to each other and to the axis used to measure the thickness of the corresponding platelet 100. Each platelet 100 can have a length in a range of about 1 µm to about 100 µm, including about 25 µm, about 50 µm, about 75 µm, and any length or length range between any two of the foregoing lengths. In addition, each platelet 100 can have a width in a range of about 1 µm to about 100 µm, including about 25 µm, about 50 µm, about 75 µm, and any width or width range between any two of the foregoing widths. The length and width of a platelet 100 can be the same or different. The lengths and widths of the ferromagnetic layer 120 and the first and second insulator layers 131, 132 in a given platelet 100 are the same as the length and width, respectively, of that platelet 100. The ratio of the thickness of the magnetic platelet 100 to the longer of width or length, which can be referred to as a cross-sectional aspect ratio, is preferably 1:10 or greater (e.g., 1:20, 1:100, or another ratio). This aspect of the invention attenuates eddy currents, which would otherwise form in the magnetic platelet in the presence of an AC magnetic field. Eddy currents in the platelet would have larger amplitude (and thus larger energy loss) if the platelet were to have a cross-sectional aspect ratio closer to 1:1.

In a preferred embodiment, the platelets 100 are identical or substantially identical to each other. For example, the platelets 100 can comprise the same film layers (e.g., ferromagnetic layer 120 and insulator layers 131, 132), materials, and dimensions. In another embodiment, the platelets 100 can have different film layers, materials, and/or dimensions. In one example, the platelets 100 include a first group of platelets having a first thickness and a second group of platelets having a second thickness where the first and second thicknesses are different. Thus, one group of platelets has a relatively large thickness and the other group has a relatively small thickness. In another example, the platelets 100 include a first group of platelets having a first length and/or width and a second group of platelets having a second length and/or width where the first and second lengths and/or widths are different. Thus, one group of platelets has a relatively large length and/or width and the other group has a relatively small length and/or width.

Figure 1B:
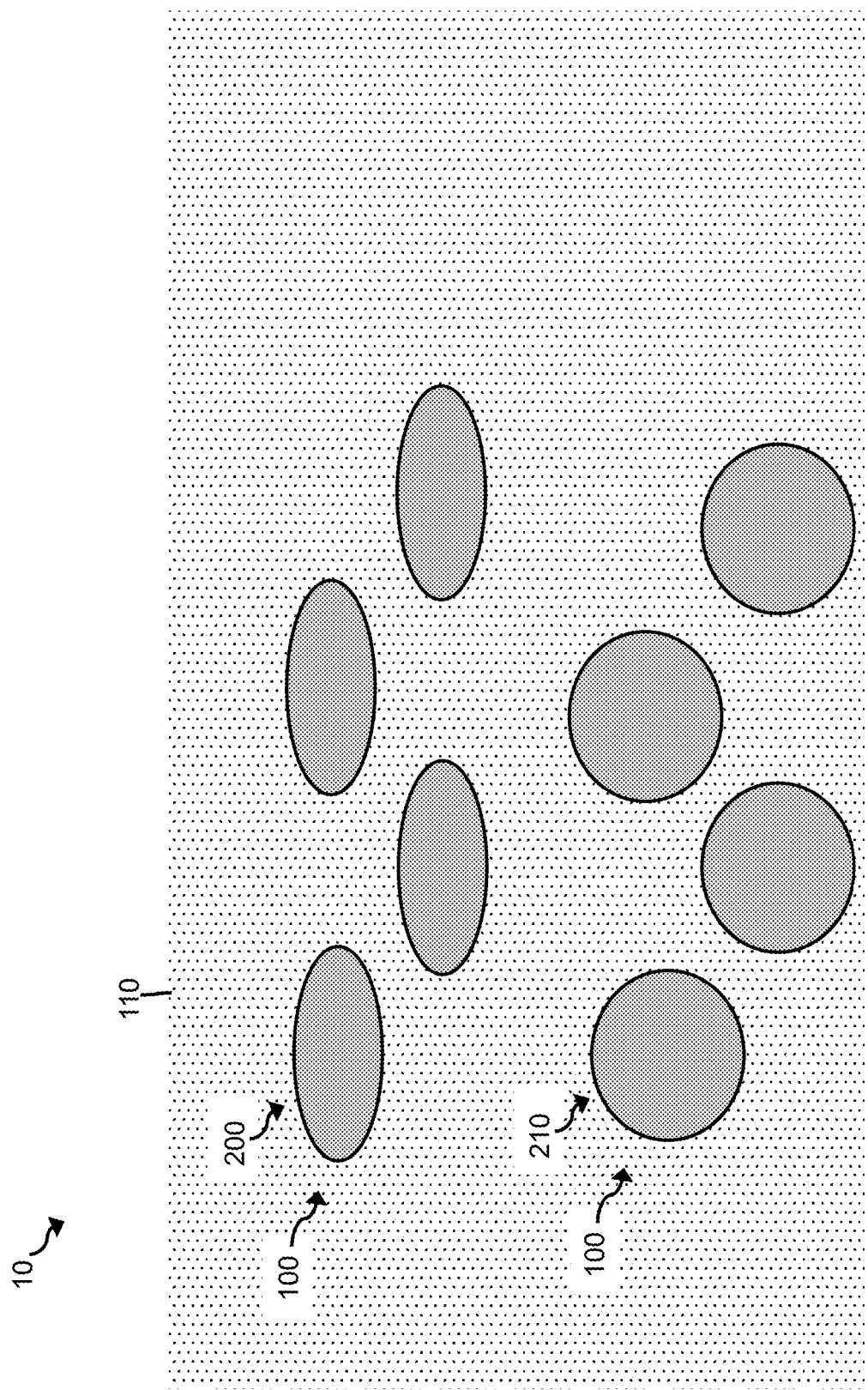
FIG. 1B is a top view of the ferromagnetic polymer composite material illustrated in FIG. 1A.

In some embodiments, the platelets 100 can have a top-view shape as an ellipse 200 and/or a disk 210, as illustrated in FIG. 1B which is a top view of ferromagnetic polymer composite material 10. The platelets 100 with the cross-sectional shape of ellipse 200 can have a three-dimensional shape of an elliptical cylinder. The platelets with the cross-sectional shape of a disk 210 can have a three-dimensional shape of a cylinder (e.g., a circular cylinder). The platelets 100 preferably have the same cross-sectional shape and/or three-dimensional shape which can allow for efficient packing of the platelets 100 in the polymer 110. The ferromagnetic polymer composite material 10 can comprise a range of about 40% to about 99% by volume of the platelets 100 and a range of about 1% to about 60% by volume of the polymer 110. In a preferred embodiment, the ferromagnetic polymer composite material 10 comprises about 75% to about 95% by volume of the platelets 100 and about 5% to about 25% by volume of the polymer 110.

The platelets 100 can have a high relative magnetic permeability and/or a low magnetic coercivity. For example, the platelets 100 can have a relative magnetic permeability of about 50 to about 2,000 and/or a coercivity of less than or equal to 1 Oe (e.g., 0-1 Oe) along the hard axis of magnetization.

The polymer 110 can comprise an epoxy, a synthetic resin, acrylonitrile butadiene styrene (ABS), nitrocellulose, polyimide, polybenzoxazole (PBO), benzocyclobutene, divinylsiloxane-bis-benzocyclobutene, polytetrafluoroethylene (PTFE), polysiloxane, polydimthylsiloxane (PDMS), polymethyl-methacylate (PMMA), parylene, an aromatic polymer, and/or a photo-imageable polymer (e.g., a photoresist). In some embodiments, the polymer 110 can comprise a spin-on dielectric. The polymer 110 can be in liquid or solid form.

The ferromagnetic polymer composite material 10 can have a high relative magnetic permeability and/or a low magnetic coercivity. The material 10 can have a relative magnetic permeability that is approximately equal to the volume percentage of platelets 100 in the ferromagnetic polymer composite material 10 multiplied by the relative magnetic permeability of the platelets 100. For example, when the ferromagnetic polymer composite material 10 comprises 75% platelets by volume, the relative magnetic permeability of the ferromagnetic polymer composite material 10 is approximately equal to 75% multiplied by the relative magnetic permeability of the platelets 100. The magnetic coercivity of the ferromagnetic polymer composite material 10 can be approximately equal to the magnetic coercivity of the platelets 100.

The ferromagnetic layer 120 can comprise a soft magnetic layer, a hard magnetic layer, or both hard and soft ferromagnetic layers. When the ferromagnetic layer 120 includes both soft and hard ferromagnetic layers, the hard ferromagnetic layer forms a permanent magnetic field that can bias adjacent/neighboring soft ferromagnetic layer(s), which in-turn can enhance the properties of the biased soft ferromagnetic layer(s). In addition, the hard ferromagnetic layer increases the remanence magnetization of the platelet, which improves the ability to align the platelet to an external magnetic field.

FIG. 2B is an example cross-sectional view of a ferromagnetic film platelet 100 according to an alternative embodiment. For illustration purposes, the cross section in FIG. 2B is orthogonal to the cross section illustrated in FIG. 2A. In this embodiment, the ferromagnetic layer 120 includes a soft ferromagnetic layer 221 and a hard ferromagnetic layer 222 that are magnetically coupled to each other. A spacer or insulator layer can optionally be disposed between the soft and hard ferromagnetic layers 221, 222. The hard ferromagnetic layer 222 can have a magnetic coercivity of at least about 100 Oe and/or a remnant magnetization of at least about 0.1 T. The soft ferromagnetic layer 221 can have a magnetic coercivity of less than or equal to about 1 Oe.

The hard ferromagnetic layer 222 is magnetically anisotropic such that its easy axis of magnetization 225 is parallel to the Y axis. In addition, the soft ferromagnetic layer 221 is magnetically anisotropic such that its easy axis of magnetization 228 is parallel to the Y axis. As such, the easy axis of magnetization 225 of the hard ferromagnetic layer 222 is parallel to the easy axis of magnetization 228 of the soft ferromagnetic layer 221.

The hard ferromagnetic layer 222 is magnetized to produce a bias magnetic field. The in-plane bias magnetic field flux 240, from the bias magnetic field, through the hard ferromagnetic layer 222 is in a first direction (e.g., from right to left as indicated by the arrows in FIG. 2B) that is parallel to the easy axis of magnetization 225 of the hard ferromagnetic layer 222. The bias magnetic field flux 240 through the hard ferromagnetic layer 422 forms a closed bias magnetic field loop by passing through the neighboring soft ferromagnetic layer 221. The bias magnetic flux 240 through the soft ferromagnetic layer 221 is in a second direction (e.g., from left to right) that is opposite (e.g., antiparallel) to the first direction. The second direction is parallel to the easy axis of magnetization 228 of the soft ferromagnetic layer 221.

The cross-sectional thickness of the soft and hard ferromagnetic layers 221, 222 can be related to their saturation magnetizations. For example, the ratio of the cross-sectional thickness of the soft ferromagnetic layer 221 to the cross-sectional thickness of the hard ferromagnetic layer 222 can be equal to or about equal to $$\frac{M_{S\_soft}}{M_{S\_hard}}$$

where $M_{S\_soft}$ is the saturation magnetization of the soft ferromagnetic layer 221 and $M_{S\_hard}$ is the saturation magnetization of each hard ferromagnetic layer 222. Thus, all or substantially all of the bias magnetic field flux 240 can form a closed bias magnetic field loop, as discussed above. In some embodiments, the ratio of the cross-sectional thickness of the soft ferromagnetic layer 221 to the cross-sectional thickness of the hard ferromagnetic layer 222 is greater than or equal to 10 (e.g., 10 to 1,000, 10 to 500, or 10 to 100). The cross-sectional thickness of the soft and hard ferromagnetic layer 221, 222 can be measured with respect to the Z axis in FIG. 2B.

The embodiments of FIGS. 2A and 2B can be combined such that the second insulator layer 132 can form sidewalls 232 on some or all of the sides of the soft and/or hard ferromagnetic layers 221, 222.

FIG. 3A is an example cross-sectional view of a ferromagnetic film platelet 300 according to an alternative embodiment. The platelet 300 can be used in place of or in addition to the platelet 100 in the ferromagnetic polymer composite material 10. The platelet 300 includes a plurality of non-ferromagnetic layers 310, a plurality of ferromagnetic layers 320, and first and second insulator layers 331, 332.

Each ferromagnetic layer 320 can be the same as ferromagnetic layer 120. The ferromagnetic layers 320 can have the same thicknesses, different thicknesses, or a combination thereof. The thickness of each ferromagnetic layer can be measured along or with respect to an axis 345 that is orthogonal to a plane 340 that passes through and is parallel to the interface 335 between the ferromagnetic layer 320 and the first insulator layer 331. The axis 345 can be the same as the Z axis or can be parallel to the Z axis. Each ferromagnetic layer 320 can have the same thickness as ferromagnetic layer 120.

The platelet 300 can have a cross-sectional aspect ratio that is the same as the cross-sectional aspect ratio of platelet 100.

One, some, or all ferromagnetic layers 320 can be magnetically anisotropic such that its/their easy axis of magnetization 322 is parallel to the Y axis and its/their hard axis of magnetization 324 is parallel to the X axis. Alternatively, the easy axis of magnetization 322 can be parallel to the X axis and the hard axis of magnetization 324 can be parallel to the Y axis. The easy and hard axes 322, 324 can be permanently or semi-permanently set. The easy and hard axes 322, 324 are orthogonal to each other within the x-y plane. In addition, the easy and hard axes 322, 324 are parallel to plane 340. The easy and hard axes 322, 324 of each ferromagnetic layer 320 can be aligned or substantially aligned (e.g., within 5°) with the respective easy and hard axes 322, 324 of the other ferromagnetic layers 320.

The first and second insulator layers 331, 332 can be the same as first and second insulator layers 131, 132, respectively. The thickness of the first and second insulator layers 331, 332 can be the same as the thickness of the first and second insulator layers 131, 132, respectively. Some of the material in second insulator layer 332 may form on the side of the platelet 300 during fabrication and can provide electrical insulation and a diffusion barrier along the side of the platelet 300. For example, the second insulator layer 332 can form sidewalls 432 on some or all of the sides of the ferromagnetic layer 120, as illustrated in FIG. 3B.

Each non-ferromagnetic layer 310 is disposed between a neighboring pair 350 of ferromagnetic layers 320. Each non-ferromagnetic layer 310 can function as an electrical insulator layer and/or a diffusion barrier (e.g., with respect to neighboring ferromagnetic layers). Each non-ferromagnetic layer 310 can comprise aluminum, chromium, cobalt, silicon, tantalum, titanium, silicon, and/or zirconium. In some embodiments, each non-ferromagnetic layer 310 can comprise an alloy or compound that includes aluminum, chromium, cobalt, silicon, tantalum, titanium, silicon, and/or zirconium. For example, each non-ferromagnetic layer 310 can comprise a compound that includes (a) oxygen and/or nitrogen and (b) aluminum, chromium, cobalt, silicon, tantalum, titanium, silicon, and/or zirconium. Specific examples of diffusion barriers can comprise tantalum, chromium, and/or aluminum. The non-ferromagnetic layers 310 can comprise the same or different materials. In some embodiments, each non-ferromagnetic layer 310 is the same as first and/or second insulator layer(s) 331, 332.

The non-ferromagnetic layers 310 can have the same thicknesses, different thicknesses, or a combination thereof. The thickness of each non-ferromagnetic layer 310 can be measured along or with respect to axis 345. In some embodiments, each non-ferromagnetic layer 310 has the same thickness as the thickness of the first and/or second insulator layer(s) 331, 332.

The cross-sectional and three-dimensional shapes of platelet 300 can be the same as cross-sectional and three-dimensional shapes of platelet 100. A top view of platelet 300 can appear the same as the top view of material 10, as illustrated in FIG. 1B. In addition, the overall or total thickness of platelet 300 can be in a range of about 206 nm to about 10.6 µm. The thickness of each platelet 300 can be measured along or parallel to the Z axis or another axis that is orthogonal to the plane 340.

The length and width of platelet 300 can be measured along or parallel to the X axis and the Y axis, respectively. The length and width of platelet 300 can also be measured with respect to first and second axes that are parallel to the plane 340 where the first and second axes are orthogonal to each other and to axis 345. The length and width of platelet 300 can be the same as the length and width, respectively, of platelet 100. The lengths and widths of the non-ferromagnetic layers 310, the ferromagnetic layers 320, and the first and second insulator layers 331, 332 are the same as the length and width, respectively, of platelet 300.

The platelets 300 can have a high magnetic permeability and/or a low magnetic coercivity. The relative magnetic permeability and/or the magnetic coercivity of platelets 300 can be the same as the relative magnetic permeability and/or the magnetic coercivity of platelets 100, respectively.

Ferromagnetic layers 320 can be soft magnetic layers or hard magnetic layers, and a platelet 300 can include both soft and hard ferromagnetic layers. The hard ferromagnetic layer(s) form a permanent magnetic field that can bias adjacent/neighboring soft ferromagnetic layer(s), which in-turn can enhance the properties of the biased soft ferromagnetic layer(s). In addition, the hard ferromagnetic layer(s) increase the remanence magnetization of the platelet, which improves the ability to align the platelet to an external magnetic field.

Figure 3C:
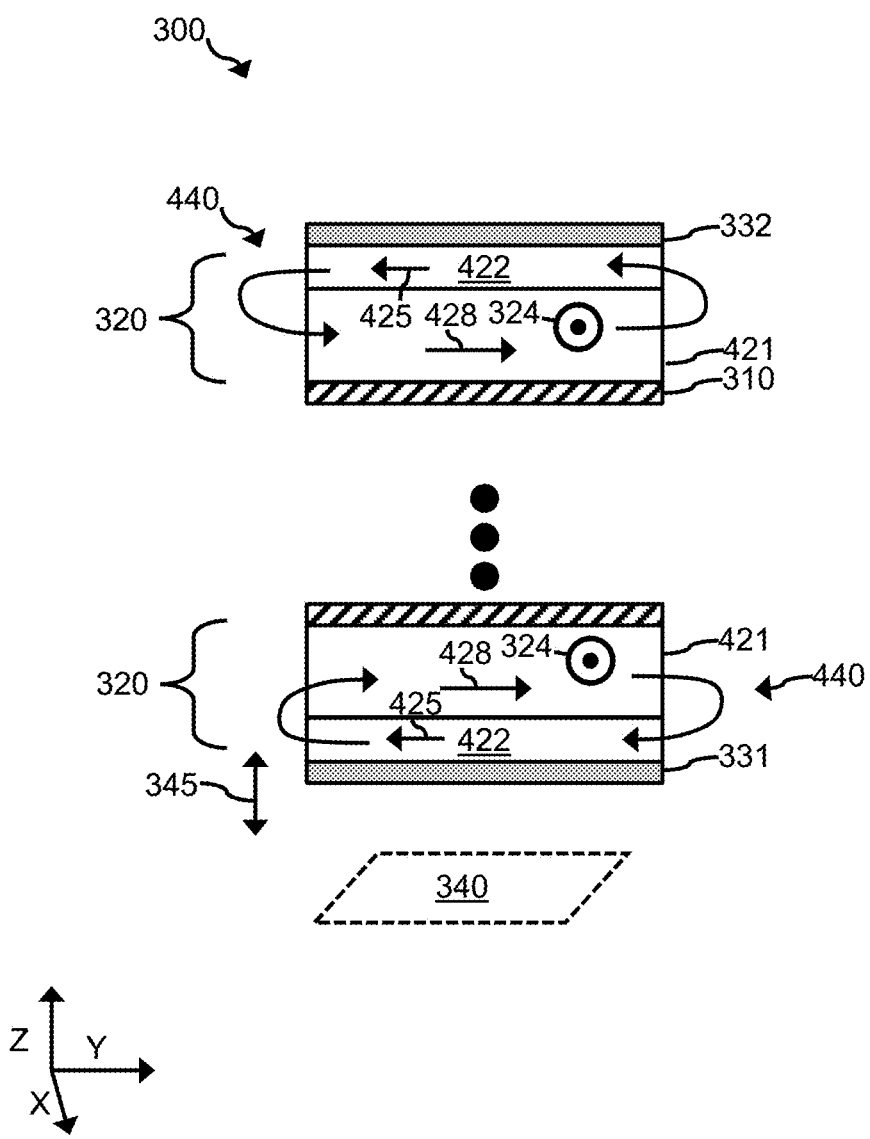

FIG. 3C is an example cross-sectional view of a ferromagnetic film platelet 300 according to an alternative embodiment. For illustration purposes, the cross section in FIG. 3C is orthogonal to the cross section illustrated in FIGS. 3A and 3B. In this embodiment, each ferromagnetic layer 320 includes a soft ferromagnetic layer 421 and a hard ferromagnetic layer 422 that are magnetically coupled to each other. A spacer or insulator layer can optionally be disposed between the soft and hard ferromagnetic layers 421, 422 in each ferromagnetic layer 320. A non-ferromagnetic layer 310 is disposed between adjacent ferromagnetic layers 320. The hard ferromagnetic layer 422 is magnetically anisotropic such that its easy axis of magnetization 425 is parallel to the Y axis. In addition, the soft ferromagnetic layer 421 is magnetically anisotropic such that its easy axis of magnetization 428 is parallel to the Y axis. As such, the easy axis of magnetization 425 of the hard ferromagnetic layer 422 is parallel to the easy axis of magnetization 428 of the soft ferromagnetic layer 421.

The hard ferromagnetic layer 422 is magnetized to produce a bias magnetic field. The in-plane bias magnetic field flux 440, from the bias magnetic field, through the hard ferromagnetic layer 422 is in a first direction (e.g., from right to left as indicated by the arrows in FIG. 3C) that is parallel to the easy axis of magnetization 425 of the hard ferromagnetic layer 422. The bias magnetic field flux 440 through the hard ferromagnetic layer 422 forms a closed bias magnetic field loop by passing through the neighboring soft ferromagnetic layer 421. The bias magnetic flux 440 through the soft ferromagnetic layer 421 is in a second direction (e.g., from left to right) that is opposite (e.g., antiparallel) to the first direction. The second direction is parallel to the easy axis of magnetization 428 of the soft ferromagnetic layer 421.

The cross-sectional thickness of the soft and hard ferromagnetic layers 421, 422 can be related to their saturation magnetizations. For example, the ratio of the cross-sectional thickness of the soft ferromagnetic layer 421 to the cross-sectional thickness of the hard ferromagnetic layer 422 can be equal to or about equal to $$\frac{M_{S\_soft}}{M_{S\_hard}}$$

where $M_{S\_soft}$ is the saturation magnetization of the soft ferromagnetic layer 421 and $M_{S\_hard}$ is the saturation magnetization of each hard ferromagnetic layer 422. Thus, all or substantially all of the bias magnetic field flux 440 can form a closed bias magnetic field loop, as discussed above. In some embodiments, the ratio of the cross-sectional thickness of the soft ferromagnetic layer 421 to the cross-sectional thickness of the hard ferromagnetic layer 422 is greater than or equal to 10 (e.g., 10 to 1,000, 10 to 500, or 10 to 100). The cross-sectional thickness of the soft and hard ferromagnetic layers 421, 422 can be measured with respect to the axis 345.

The embodiments of FIGS. 3B and 3C can be combined such that the second insulator layer 332 can form sidewalls 432 on some or all of the sides of the soft and/or hard ferromagnetic layers 421, 422. The soft and/or hard ferromagnetic layers 421, 422 can be the same as soft and/or hard ferromagnetic layers 221, 222, respectively.

Figure 4:
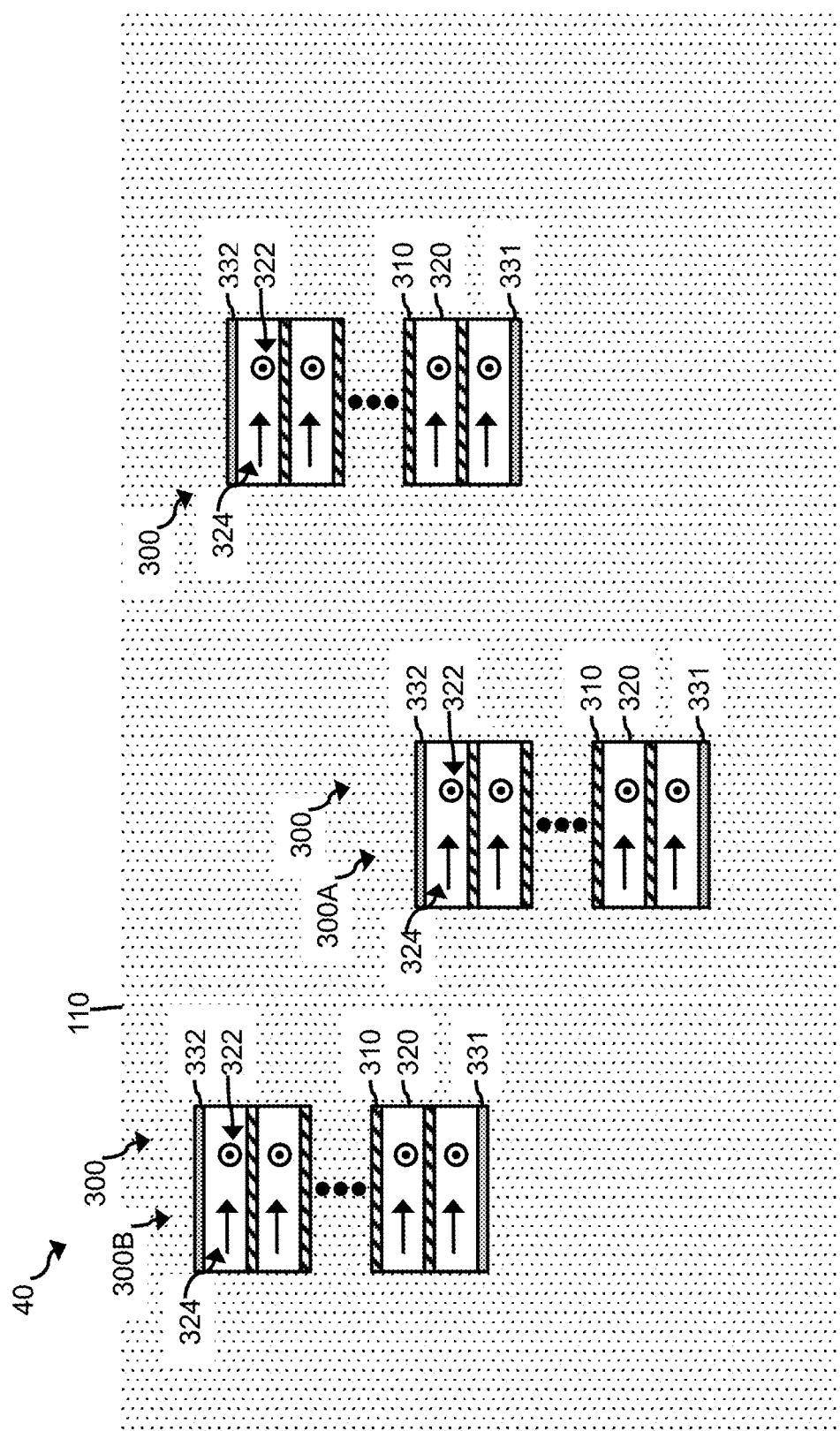
FIG. 4 is a cross-sectional view of a ferromagnetic polymer composite material according to an alternative embodiment.

FIG. 4 is an example cross-sectional view of a ferromagnetic polymer composite material 40 according to an alternative embodiment. The material 40 is the same as material 10 except that the material 40 includes platelets 300 instead of platelets 100. In some embodiments, material 10 and/or 40 can include both platelets 100, 300. The platelets 300 are disposed in the polymer 110. For example, the platelets 300 can be dispersed, distributed, embedded, and/or mixed in the polymer 110.

As discussed above, one or more of the ferromagnetic layers 320 can be magnetically anisotropic. As illustrated, the easy and hard axes of magnetization 322, 324 of the ferromagnetic layers 320 in a given platelet 300 are aligned or substantially aligned (e.g., within about 5°) with each other. In addition, the easy and/or hard axes of magnetization 322, 324 in the platelets 300 are aligned or substantially aligned (e.g., within about 5°). For example, the easy and/or hard axes of magnetization 322, 324 in a first platelet 300A are aligned or substantially aligned (e.g., within about 5°) with the easy and/or hard axes of magnetization 322, 324 in the other platelets 300, such as the easy and/or hard axes of magnetization 322, 324 in a second platelet 300B.

The ferromagnetic polymer composite material 40 can comprise a range of about 40% to about 99% by volume of the platelets 300 and a range of about 1% to about 60% by volume of the polymer 110. In a preferred embodiment, the ferromagnetic polymer composite material 40 comprises about 75% to about 95% by volume of the platelets 300 and about 5% to about 25% by volume of the polymer 110.

The ferromagnetic polymer composite material 40 can have a high magnetic permeability and/or a low magnetic coercivity. The magnetic permeability and/or magnetic coercitivity of material 40 can be the same as the magnetic permeability and/or the magnetic coercitivity of material 10, respectively. The AC properties of material 40 can be different than those of material 10. For example, the eddy current losses of material 40 may be lower than material 10 due to the increase use of insulating laminations (e.g., ferromagnetic layers 310) in the platelets 300.

Figure 5:
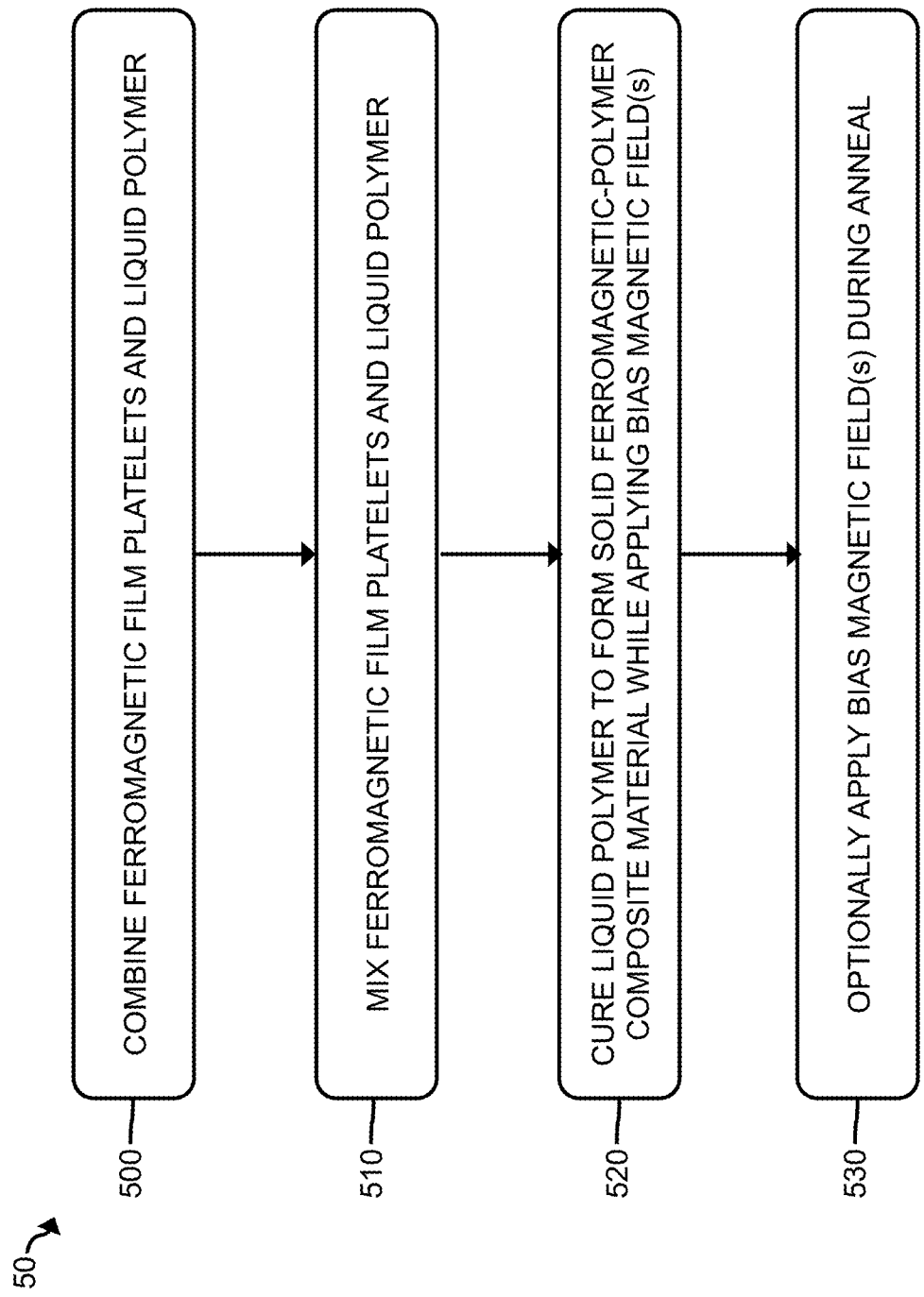
FIG. 5 is a flow chart of a method for manufacturing a ferromagnetic polymer composite material according to an embodiment.

FIG. 5 is a flow chart of a method 50 for manufacturing a ferromagnetic polymer composite material according to an embodiment. Method 50 can be used to manufacture materials 10, 40.

In step 500, a plurality of ferromagnetic film platelets and a liquid polymer are combined to form a composite material. The platelets can be the same as platelets 100 and/or 300. The platelets can be manufactured as described herein. For example, the platelets can be manufactured so that one or more ferromagnetic layers is/are magnetically anisotropic in which the easy axis of magnetization is aligned with a first axis and the hard axis of magnetization if aligned with a second axis that is orthogonal to the first axis and within the major plane of the corresponding ferromagnetic layer. The polymer can be the same as polymer 110. The ratio of platelets to polymer can be controlled to provide a desired concentration (e.g., by volume) of platelets in the composite material. For example, the ratio can be controlled so that the composite material is about 40% to about 99% by volume of platelets and about 1% to about 60% by volume of liquid polymer. In a preferred embodiment, the composite material comprises about 75% to about 95% by volume of the platelets and about 5% to about 25% by volume of the liquid polymer. The platelets and liquid polymer can be combined in a container, a jar, or other vessel. The vessel is preferably formed of a material that is not reactive with the platelets or the liquid polymer. For example, the material can include glass, stainless, steel, and/or plastic.

In step 510, the composite material is mixed. Examples of mixing include stirring, agitating, kneading, and/or ultrasonically sonicating the platelets.

In step 520, the composite material is cured to form a solid ferromagnetic-polymer material while simultaneously applying one or more bias magnetic fields. The composite material can be cured by exposing the composite material to a heat source, placing the composite material in an oven or on a hot plate, placing the composite material near a high-intensity lamp, and/or exposing the composite material to a laser or ultraviolet light, or simply waiting for the polymer to cure in ambient. A DC or AC magnetic field may be applied to the magnetic polymer before or during the curing process. The bias magnetic field is applied in order to physically align the magnetic platelets into a preferable direction before the polymer hardens, inducing a magnetic anisotropy into the composite material.

Figure 6:
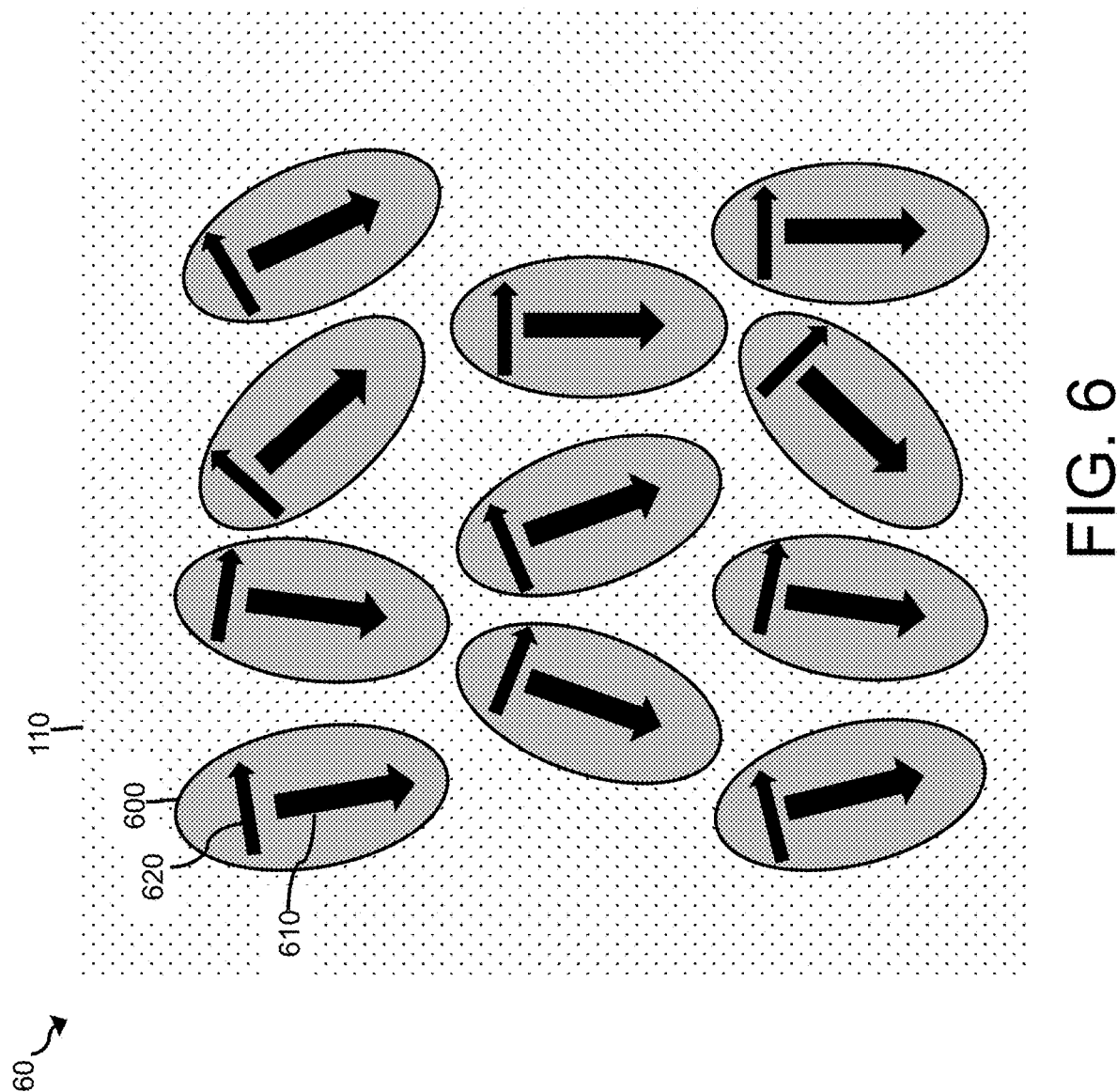
FIGS. 6 and 7 are top views of a ferromagnetic polymer composite material to illustrate certain steps of the flow chart illustrated in FIG. 5.

FIG. 6 is an example top view of a ferromagnetic polymer composite material 60 after the mixing step 510 according to an embodiment. The composite material 60 can be the same as composite material 10, 40. The composite material includes a plurality of ferromagnetic film platelets 600, which can be the same as platelets 100, 300. Each platelet 600 has one or more magnetically-anisotropic ferromagnetic layers in which the respective easy axis of magnetization 610 is aligned according to the arrow and the respective hard axis of magnetization 620 is aligned orthogonally to the easy axis 610. As can be seen, the easy axes of magnetization 610 point in different directions and are not aligned with each other. The platelets 600 may also be tilted such that the hard axes of magnetization 620 are not aligned. Thus, the composite material 60 is in an unaligned state in which the easy and hard axes of magnetization 610, 620 in the respective platelets 600 are not aligned. The composite material 60 is not magnetically anisotropic in the unaligned state.

Figure 7:
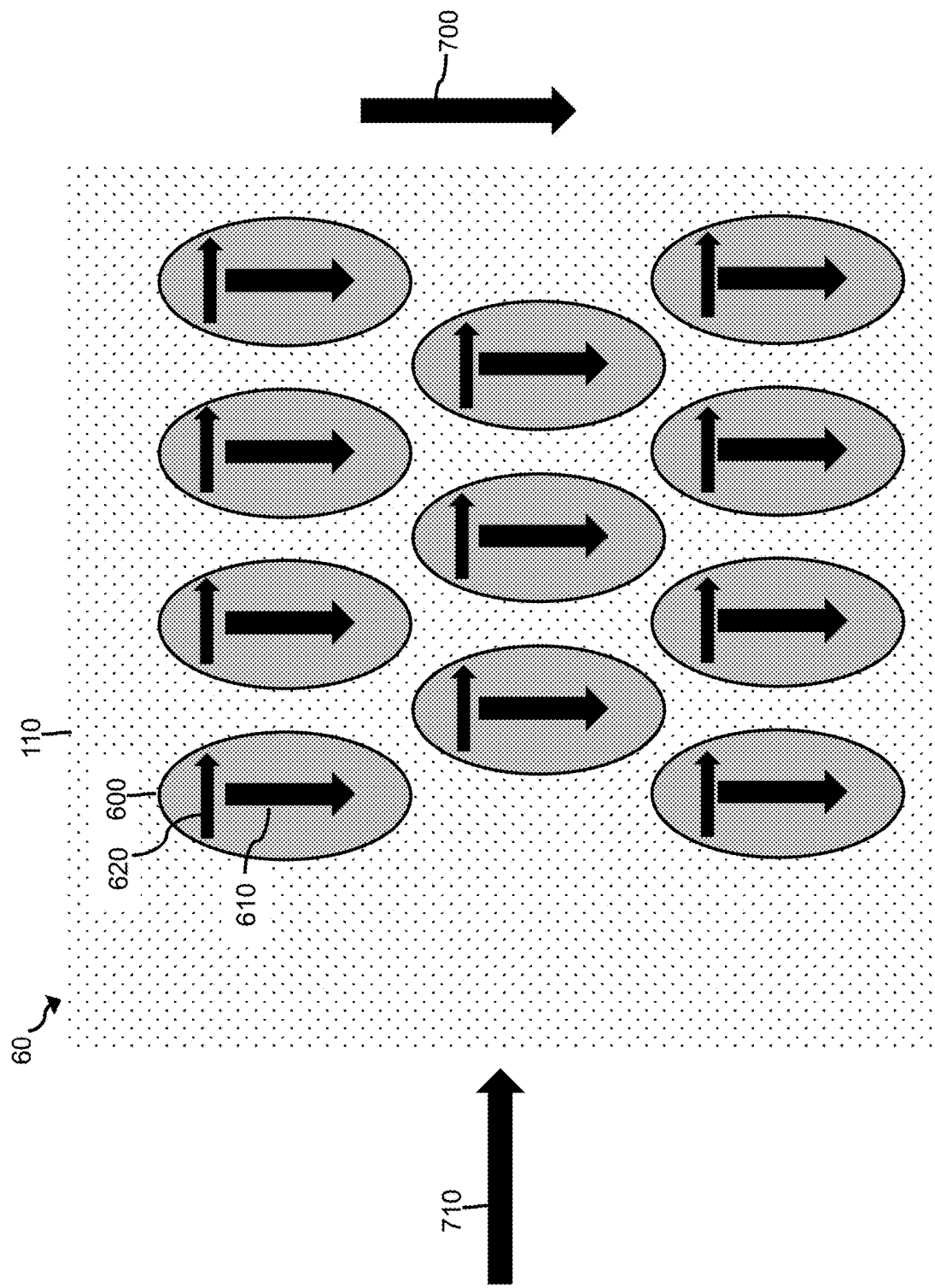

FIG. 7 is an example top view of the ferromagnetic polymer composite material 60 after a bias magnetic field 700 is applied to the ferromagnetic polymer composite material 60 during curing process 520. The bias magnetic field 700 causes the platelets 600 to align their respective easy axes of magnetization 610. When the easy axes of magnetization 610 are aligned, the corresponding hard axes of magnetization 620 are also aligned. Thus, the composite material 60 is in an aligned state in which the respective easy and hard axes of magnetization 610, 620 in the platelets 600 are aligned. The composite material 60 is magnetically anisotropic in the aligned state. The bias magnetic field 700 does not need to be uniform in amplitude or direction throughout the composite material 60. The bias magnetic field 700 can be a DC magnetic field, an AC magnetic field, or a combination thereof.

In some embodiments, an optional secondary bias magnetic field 710 can be applied to the composite material 60. The secondary bias magnetic field 710 is in a direction that is orthogonal to the primary bias magnetic field 700. The magnitude of the secondary bias magnetic field 710 is lower than the primary bias magnetic field 700, which can cause the easy axes of magnetization 610 to align with the primary bias magnetic field 700 instead of the secondary bias magnetic field 710. For example, the ratio of the magnitude of the secondary bias magnetic field 710 to that of the primary bias magnetic field 700 can be about 1:10. The secondary bias magnetic field 710 can be a DC magnetic field, an AC magnetic field, or a combination thereof.

The bias magnetic fields 700, 710 can be applied during the curing step 520. When the magnetic fields 700, 710 are applied during curing, the alignment directions of the easy and hard axes of magnetization 610, 620 can be permanently set when the polymer 110 transitions from a liquid state to solid state. When the easy and hard axes of magnetization 610, 620 are permanently set, the composite material 60 has a permanent magnetic anisotropy.

In optional step 530, one or more bias magnetic fields can be applied to the composite material in combination with controlled temperature and time as part of an annealing process once the polymer has cured/hardened in step 520. The annealing process induces or re-orients magnetic anisotropy in each platelet and thus aligns the easy and/or hard axes of some or all of the platelets so that the overall composite material is magnetically anisotropic. Typical annealing conditions require temperature in the range of about 200 to about 340 degrees Celsius, with a magnetic field of about 0.1 to about 1.5 Tesla and a duration of about 10 to about 200 minutes.

Figure 8:
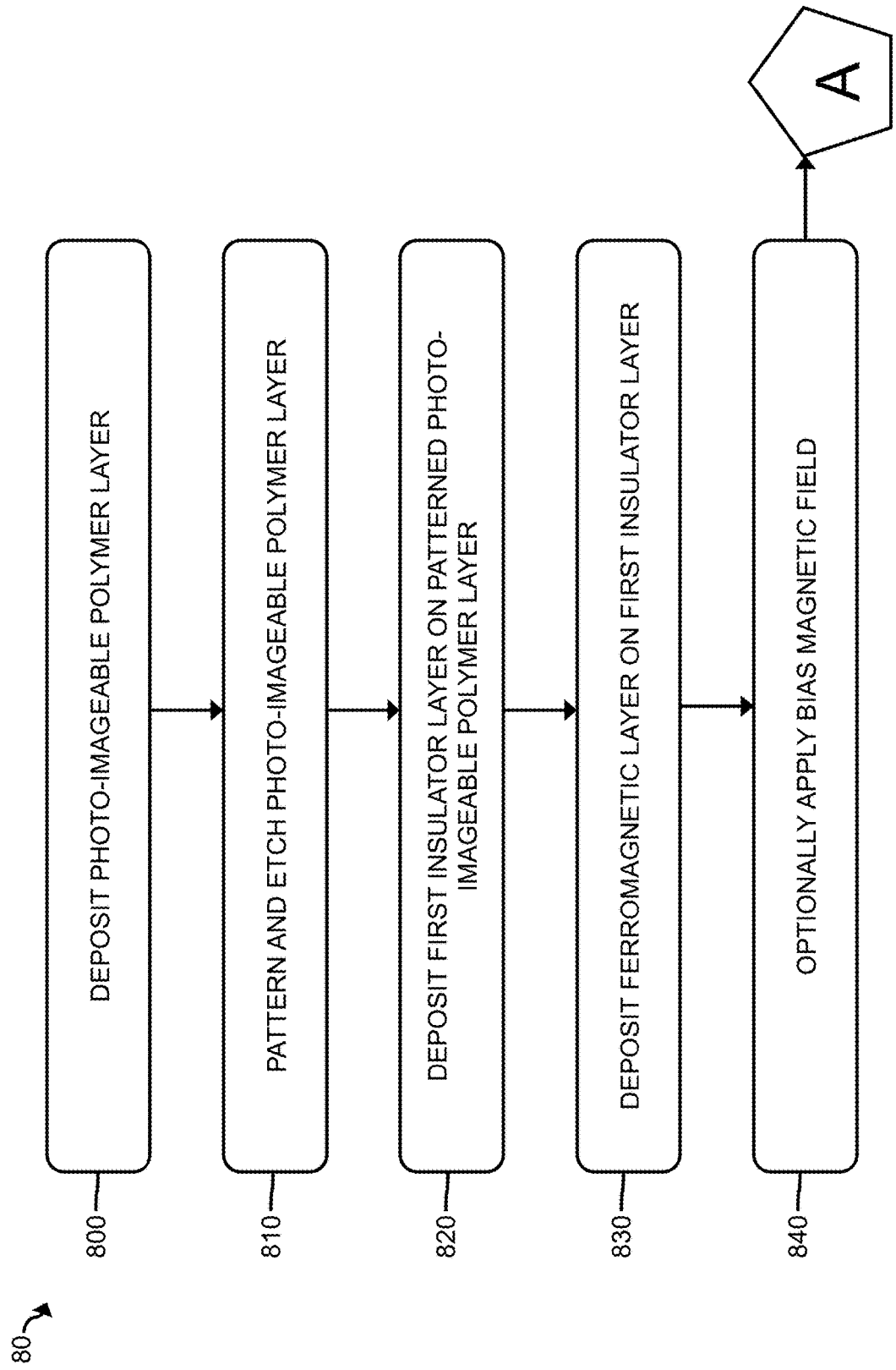
FIG. 8 is a flow chart of a method for manufacturing ferromagnetic film platelets according to an embodiment.
Figure 8:
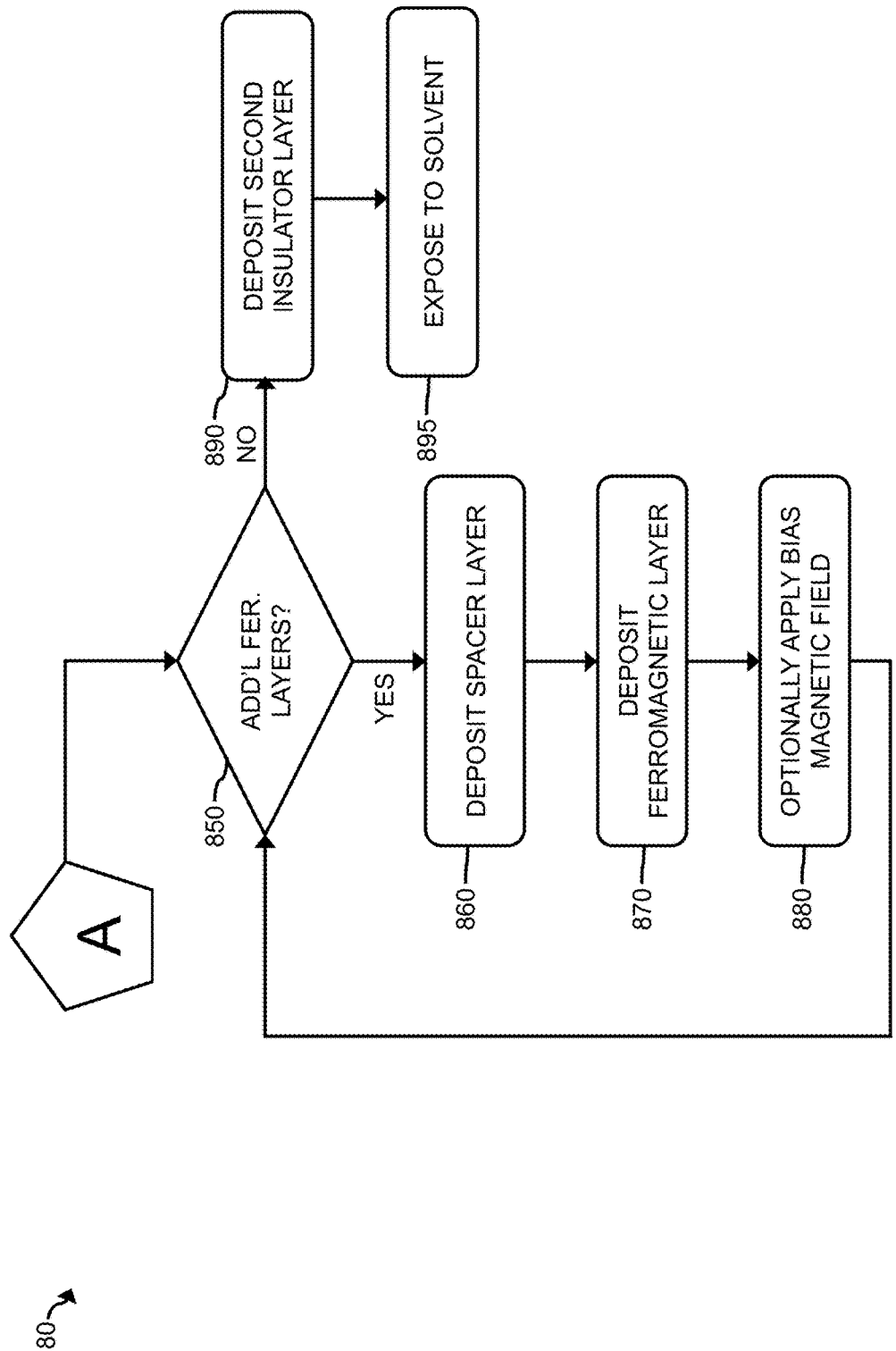

FIG. 8 is a flow chart of a method 80 for manufacturing ferromagnetic film platelets according to an embodiment. In step 800, a photo-imageable polymer is deposited on or over a substrate. The photo-imageable polymer can comprise or consist of a photoresist, which can be a positive or a negative photoresist. The substrate can comprise a semiconductor substrate or another substrate which can be suitable for semiconductor manufacturing processes. The substrate has a planar surface on which to deposit materials. FIG. 9 is an example cross-sectional illustration of a structure 90 in which a photo-imageable polymer 910 is deposited on a substrate 900 according to step 800.

In step 810, the photo-imageable polymer is exposed and developed leaving a photolithographically-patterned polymer layer on or over the substrate. FIG. 10 is an example cross-sectional illustration of structure 90 in which a patterned photo-imageable polymer 912 is formed on the substrate 900 according to step 810. The cross-sectional shape of the patterned photo-imageable polymer can correspond to the cross-sectional shape of the ferromagnetic film platelets.

In step 820, a first insulator layer is deposited on the patterned photo-imageable polymer layer. The first insulator layer can comprise or consist of the same material(s) as first insulator 131, 331. FIG. 11 is an example cross-sectional illustration of structure 90 in which a first insulator layer 920 is deposited on the photo-imageable polymer layer 912 according to step 820. This figure also illustrates that the first insulator layer 920 is deposited on the substrate 900 or other underlying layer in the voids 915 between the photo-imageable polymer segments 914.

In step 830, a ferromagnetic layer is deposited on the first insulator layer. The ferromagnetic layer can comprise or consist of the same material(s) as ferromagnetic layer 120, 320. The ferromagnetic layer can be deposited by physical vapor deposition (e.g., sputtering) or another method.

In optional step 840, a bias magnetic field is applied during or after the ferromagnetic deposition step 830. The bias magnetic field can permanently or semi-permanently set the easy axis of magnetization of the ferromagnetic layer in a direction parallel to the bias magnetic field. Permanently or semi-permanently setting the direction of the easy axis of magnetization can permanently or semi-permanently set the direction of the hard axis of magnetization in a direction orthogonal to the easy axis of magnetization in the major plane of the ferromagnetic layer. When the bias magnetic field is applied after the ferromagnetic deposition step 830, the bias magnetic field can be applied while heating or annealing the structure including the ferromagnetic layer in the form of a magnetic anneal at a temperature of about 200° C. to about 340° C. with a magnetic field of about 0.1 Tesla to about 1.5 Tesla and a duration of about 10 to about 200 minutes. The structure can be heated or annealed in an oven or can be placed near a heat source. The bias magnetic field can be a DC magnetic field.

Figure 12:
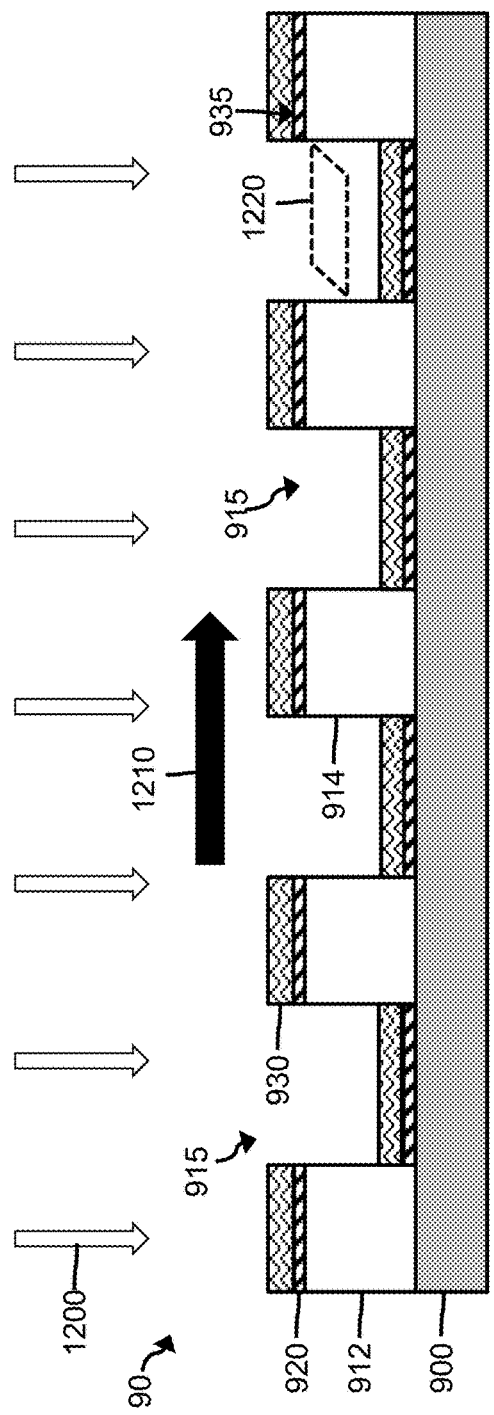

FIG. 12 is an example cross-sectional illustration of structure 90 in which a ferromagnetic layer 930 is deposited 1200 on the first insulator layer 920 according to step 830. An optional bias magnetic field 1210 can be applied during deposition 1200 of the ferromagnetic layer 930 to permanently or semi-permanently set the direction of the easy axis of magnetization of the ferromagnetic layer, according to step 840. Permanently or semi-permanently setting the direction of the easy axis of magnetization can set the permanently or semi-permanently set the direction of the hard axis of magnetization in a direction orthogonal to the easy axis of magnetization in the major plane of the ferromagnetic layer and/or parallel to a plane 1220 that passes through and is parallel to the interface 935 between the ferromagnetic layer 930 and the first insulator layer 920.

Figure 13:
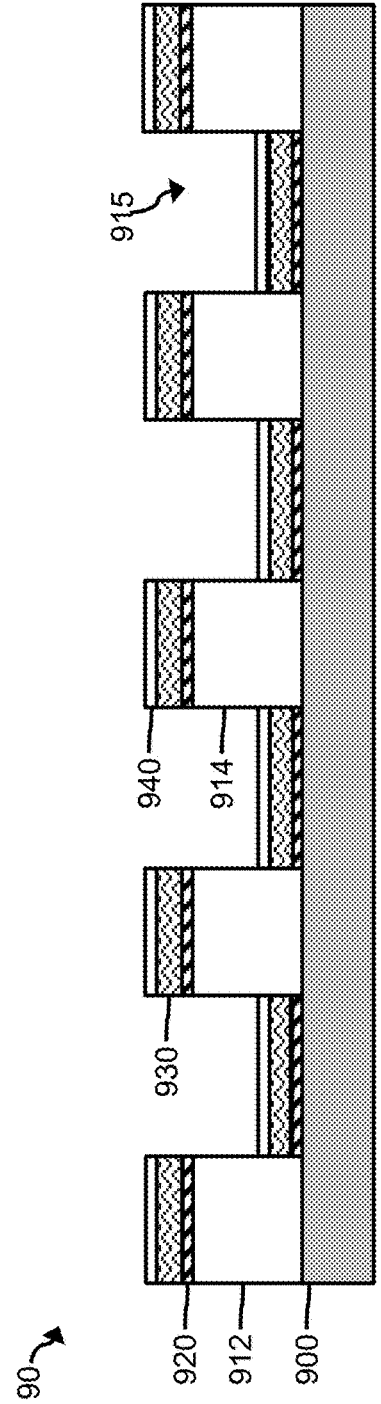

In step 850 (via placeholder A), the method 80 determines whether there are any additional ferromagnetic layers to deposit. When additional ferromagnetic layers are deposited, the method 80 proceeds to step 860 where a spacer layer is deposited on the exposed ferromagnetic layer. The spacer layer can function as an electrical insulator layer and/or a diffusion barrier (e.g., with respect to neighboring ferromagnetic layers) between a neighboring pair of ferromagnetic layers. Spacer layer can be the same as non-ferromagnetic layer 310. FIG. 13 is an example cross-sectional illustration of structure 90 in which a spacer layer 940 is deposited on the ferromagnetic layer 930 according to step 850.

In step 870, a ferromagnetic layer is deposited on the spacer layer. The ferromagnetic layer can be deposited by physical vapor deposition or another method. The ferromagnetic layer deposited in step 870 can be the same or different than the ferromagnetic layer deposited in step 830. In optional step 880, a bias magnetic field is applied during ferromagnetic deposition step 830, or after ferromagnetic deposition step 830, in the form of a magnetic anneal at a temperature of about 200° C. to about 340° C. with a magnetic field of about 0.1 Tesla to about 1.5 Tesla and a duration of about 10 to about 200 minutes to permanently or semi-permanently set the direction of the easy axis of magnetization of the ferromagnetic layer (e.g., deposited in step 870), which can permanently or semi-permanently set the direction of the hard axis of magnetization of the ferromagnetic layer (e.g., deposited in step 870). Step 880 can be the same as optional step 840.

FIG. 14 is an example cross-sectional illustration of structure 90 in which a ferromagnetic layer 930 is deposited on the spacer layer 940 according to step 850. An optional bias magnetic field 1210 can be applied during deposition 1200 of the ferromagnetic layer 930 (e.g., in step 870) to permanently or semi-permanently set the direction of the easy axis of magnetization of the ferromagnetic layer, according to step 880.

After step 870 and/or optional step 880, the flow chart returns to step 850 to determine whether additional ferromagnetic layers are to be deposited. If so, the flow chart returns in a loop through steps 860 and 870 until all ferromagnetic layers are deposited. A spacer layer is deposited between each neighboring pair of ferromagnetic layers. In some embodiments, structure 90 includes a total of 1 to 50 ferromagnetic layers.

When all ferromagnetic layers are deposited, the flow chart proceeds to step 890 where a second insulator layer is deposited. The second insulator layer is deposited on the last ferromagnetic layer deposited, either in step 830 (where only one ferromagnetic layer is deposited) or the last or only loop through step 870 (where multiple ferromagnetic layers are deposited) and/or step 880. The second insulator layer can comprise or consist of the same material(s) as second insulator layers 132, 332. FIG. 15 is an example cross-sectional illustration of structure 90 in which a second insulator layer 950 is deposited on ferromagnetic layer 930 according to step 890. Though this figure illustrates multiple ferromagnetic layers, it is understood that a similar structure would be formed when there is only one ferromagnetic layer, such as a structure that is the same as or similar to platelet 100.

After the second insulator layer is deposited in step 890, the structure including the patterned photo-imageable polymer is exposed to a solvent in step 895. The patterned photo-imageable polymer at least partially or fully dissolves in the solvent, which can release the structure deposited thereon as ferromagnetic film platelets. The released ferromagnetic film platelets can be the same as platelets 100, 300. The solvent can comprise or consist of isopropyl alcohol, acetone, ethanol, toluene, and/or another solvent.

FIG. 15 further illustrates a solvent 1500 introduced to structure 90. The cross-sectional thickness of the patterned photo-imageable polymer layer 912 (e.g., along the vertical axis in FIG. 15) is preferably larger than the thickness of the film stack formed on the patterned photo-imageable polymer layer 912 and in the voids 915 so that the solvent can reach an exposed portion 1510 of the patterned photo-imageable polymer layer 912 (e.g., segments 914) to at least partially dissolve the patterned photo-imageable polymer layer 912 (e.g., segments 914).

Figure 16:
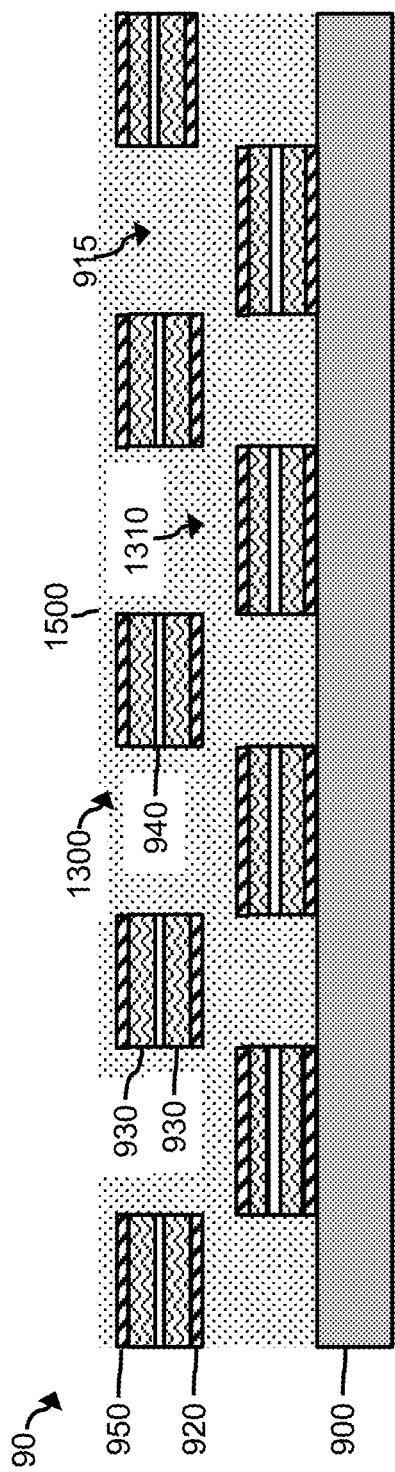

FIG. 16 is example cross-sectional illustration of structure 90 in which the patterned photo-imageable polymer layer 912 (e.g., segments 914) is dissolved and platelets 1300 are released. The released platelets 1300 can be collected to form a ferromagnetic polymer composite material (e.g., as in method 50). The released platelets 1300 can be collected with the solvent 1500 such as by decanting the solvent 1500 into a container. Alternatively, the released platelets 1300 can be collected in a filter when the solvent 1500 is removed (e.g., decanted). The structures 1310 formed in the voids 915 remain attached to the substrate 900 or underlying layer when the platelets 1300 are released. After the platelets 1300 are formed and collected, the substrate 900 can be discarded (e.g., as in a sacrificial substrate), reworked or recycled (e.g., to form additional platelets), or used for another purpose.

Figure 17:
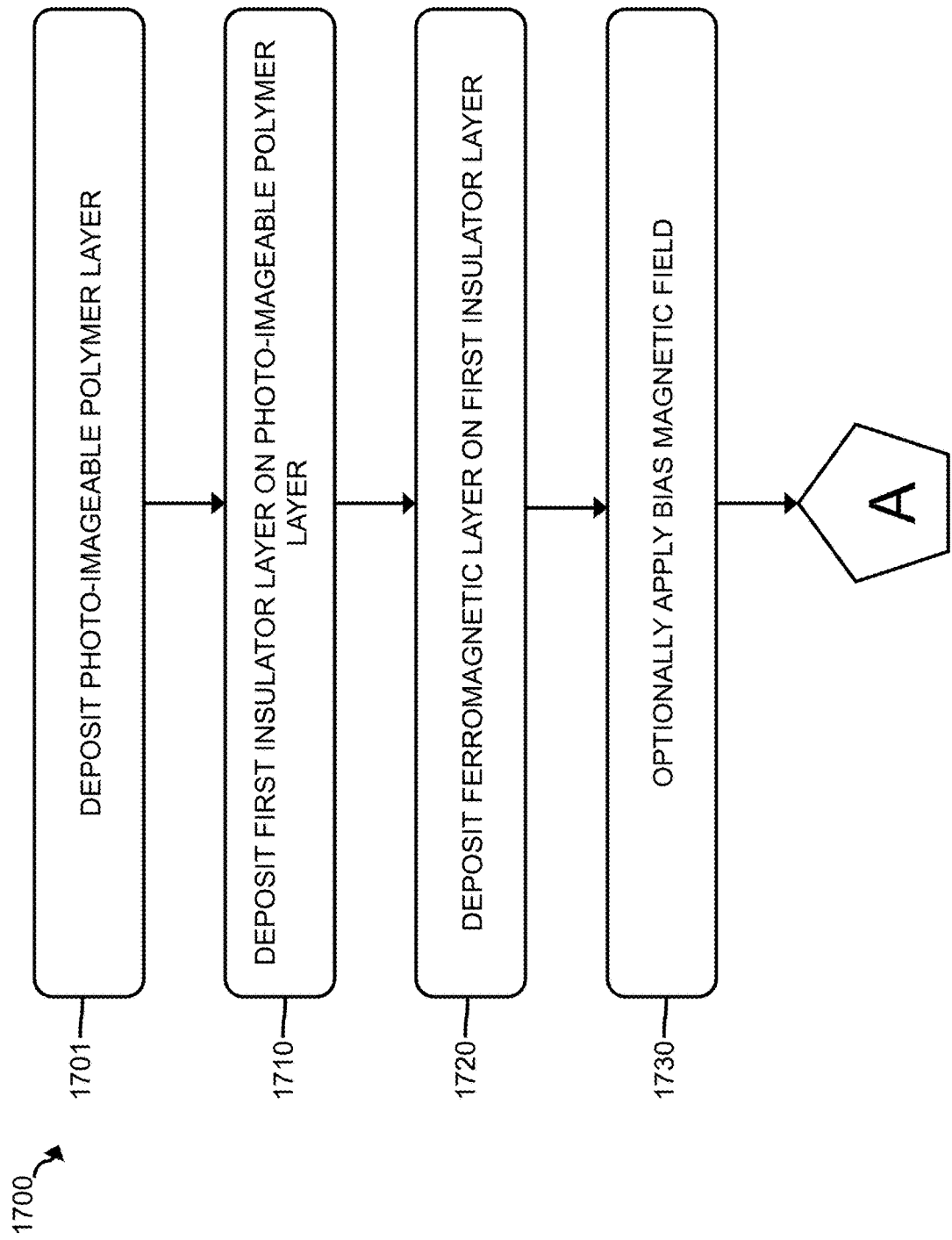
FIG. 17 is a flow chart of a method for manufacturing ferromagnetic film platelets according to an alternative embodiment.
Figure 17:
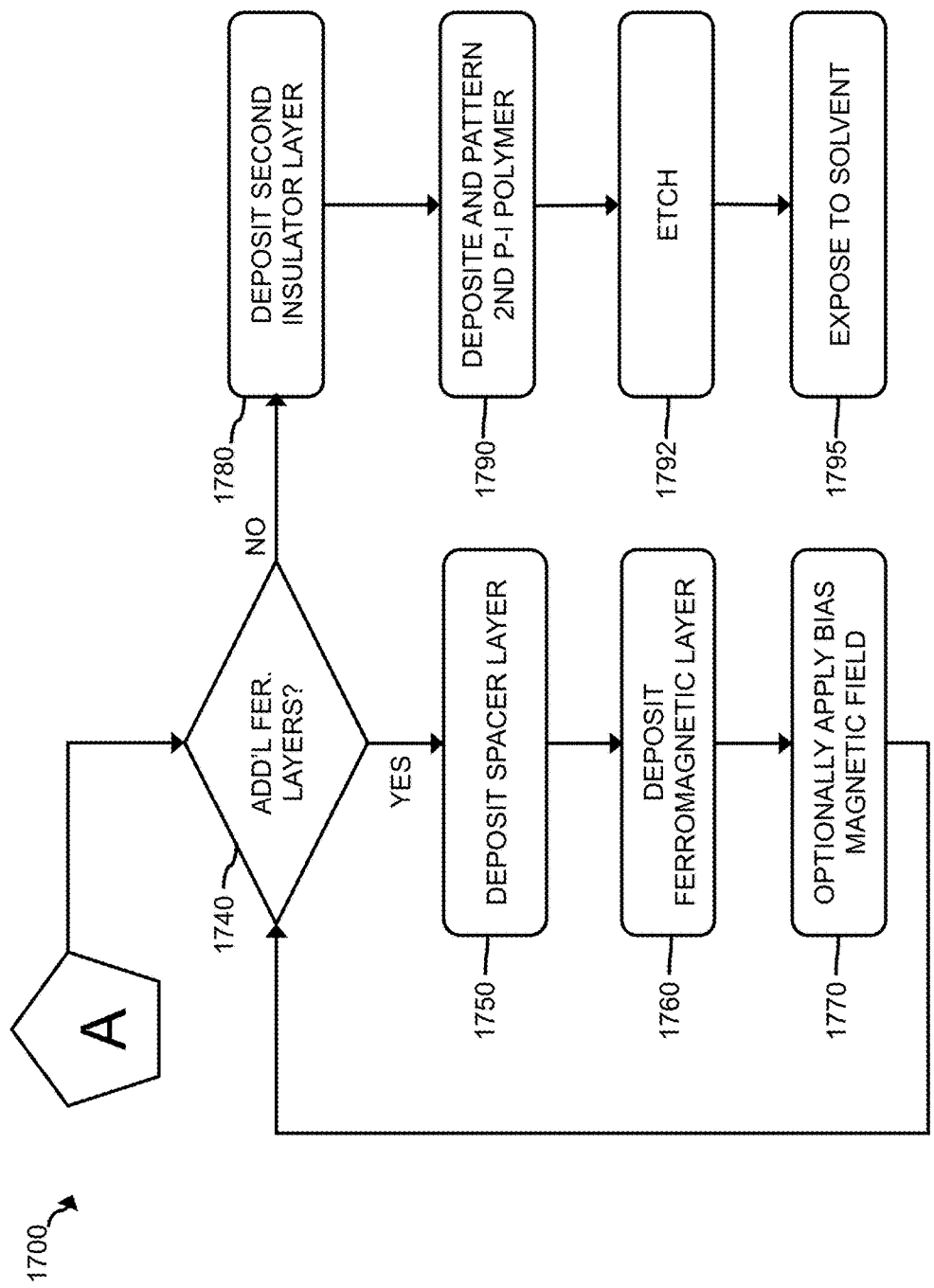

FIG. 17 is a flow chart of a method 1700 for manufacturing ferromagnetic film platelets according to an alternative embodiment. In step 1701, a photo-imageable polymer layer is deposited on or over a substrate. Step 1701 can be the same as step 800.

In step 1710, a first insulator layer is deposited on the photo-imageable polymer layer. The first insulator layer can be the same as first insulator layer 131, 331. Step 1710 can be same as step 820 except that the first insulator layer is deposited on a layer of photo-imageable polymer instead of a patterned photo-imageable polymer (i.e., there are no voids 915 in which material is deposited)

In step 1720, a ferromagnetic layer is deposited on the first insulator layer. The ferromagnetic layer can be the same as ferromagnetic layer 120, 320. Step 1720 can be the same as step 830 except there are no voids 915 in which material is deposited.

In step 1730, a bias magnetic field is optionally applied during or after the ferromagnetic deposition in step 1720. The bias magnetic field can permanently or semi-permanently set the easy axis of magnetization of the ferromagnetic layer in a direction parallel to the bias magnetic field. Permanently or semi-permanently setting the direction of the easy axis of magnetization can set the permanently or semi-permanently set the direction of the hard axis of magnetization in a direction orthogonal to the easy axis of magnetization in the major plane of the ferromagnetic layer. When the bias magnetic field is applied after the ferromagnetic deposition step 830, the bias magnetic field can be applied while heating or annealing the structure including the ferromagnetic layer. The structure can be heated or annealed in an oven or can be placed near a heat source. The bias magnetic field can be a DC magnetic field. Step 1730 can be the same as step 840.

In step 1740 (via placeholder A), the method 1700 determines whether there are any additional ferromagnetic layers to deposit. Step 1740 can be the same as step 850. When additional ferromagnetic layers are deposited, the method 1700 proceeds to step 1750 where a spacer layer is deposited on the exposed ferromagnetic layer. The spacer layer can function as an electrical insulator layer and/or a diffusion barrier (e.g., with respect to neighboring ferromagnetic layers) between a neighboring pair of ferromagnetic layers. Spacer layer can be the same as non-ferromagnetic layer 310. Step 1750 can be the same as step 860.

In step 1760 a ferromagnetic layer is deposited on the spacer layer. In step 1770, an optional bias magnetic field can be applied during and/or after the deposition of the ferromagnetic layer in step 1760. The bias magnetic field can permanently or semi-permanently set the easy axis of magnetization of the ferromagnetic layer (e.g., deposited in step 1760) in a direction parallel to the bias magnetic field. Permanently or semi-permanently setting the direction of the easy axis of magnetization can permanently or semi-permanently set the direction of the hard axis of magnetization in a direction orthogonal to the easy axis of magnetization in the major plane of the ferromagnetic layer. Steps 1760 and 1770 can be the same as steps 870 and 880, respectively.

After step 1760 and/or optional 1770, the flow chart returns to step 1740 to determine whether additional ferromagnetic layers are to be deposited. If so, the flow chart returns in a loop through steps 1750 and 1760 and optional step 1770 until all ferromagnetic layers are deposited. A spacer layer is deposited between each neighboring pair of ferromagnetic layers.

When all ferromagnetic layers are deposited, the flow chart proceeds to step 1780 where a second insulator layer is deposited. The second insulator layer is deposited on the last ferromagnetic layer deposited, either in step 1720 (where only one ferromagnetic layer is deposited) or the last or only loop through step 1760 (where multiple ferromagnetic layers are deposited). The second insulator layer can comprise or consist of the same material(s) as second insulator 132, 332. Step 1780 can be the same as step 890.

In step 1790, a second photo-imageable polymer layer is deposited on the second insulator layer and patterned. The second photo-imageable polymer layer is patterned into dimensions corresponding to the platelets to be manufactured.

Figure 18:
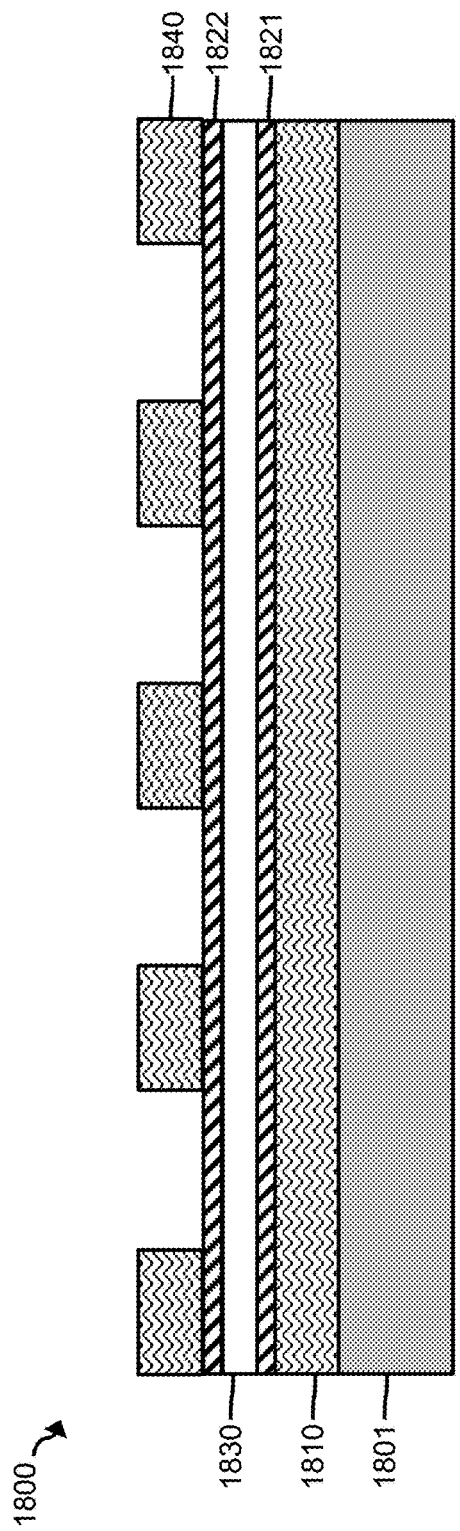

FIG. 18 is an example cross-sectional illustration of a structure 1800 formed according to step 1790. Structure 1800 includes a substrate 1801, a first photo-imageable polymer layer 1810, a first insulator layer 1821, a ferromagnetic layer 1830, a second insulator layer 1822, and a patterned second insulator layer 1840. The substrate 1801 can be a semiconductor substrate and can have a major planar surface on which to deposit one or more materials. The substrate 1801 can be suitable for semiconductor manufacturing and can comprise or consist of silicon, a compound that includes silicon, or another substance. The substrate 1801 can be the same as substrate 900. The first photo-imageable polymer layer 1810, first insulator layer 1821, ferromagnetic layer 1830, and second insulator layer 1822 can be the same as photo-imageable polymer layer 910, first insulator layer 131, 331, and/or 920, ferromagnetic layer 120, 320, and/or 930, and second insulator layer 132, 332, and/or 950, respectively. The patterned second insulator layer 1840 can be the same as patterned photo-imageable polymer layer 912. For illustration purposes, there is only one ferromagnetic layer 1830 in structure 1800. However, structure 1800 can include one or more additional ferromagnetic layers having a spacer layer between each neighboring pair of ferromagnetic layers, for example as illustrated in FIGS. 3 and 14.

In step 1792, the structure is etched according to the patterns defined in step 1790 to form mesa structures. The structure can be etched using a dry and/or a wet etch in one or more processing operations. The structure is etched down to the substrate or the layer on which the first photo-imageable polymer was deposited.

Figure 19:
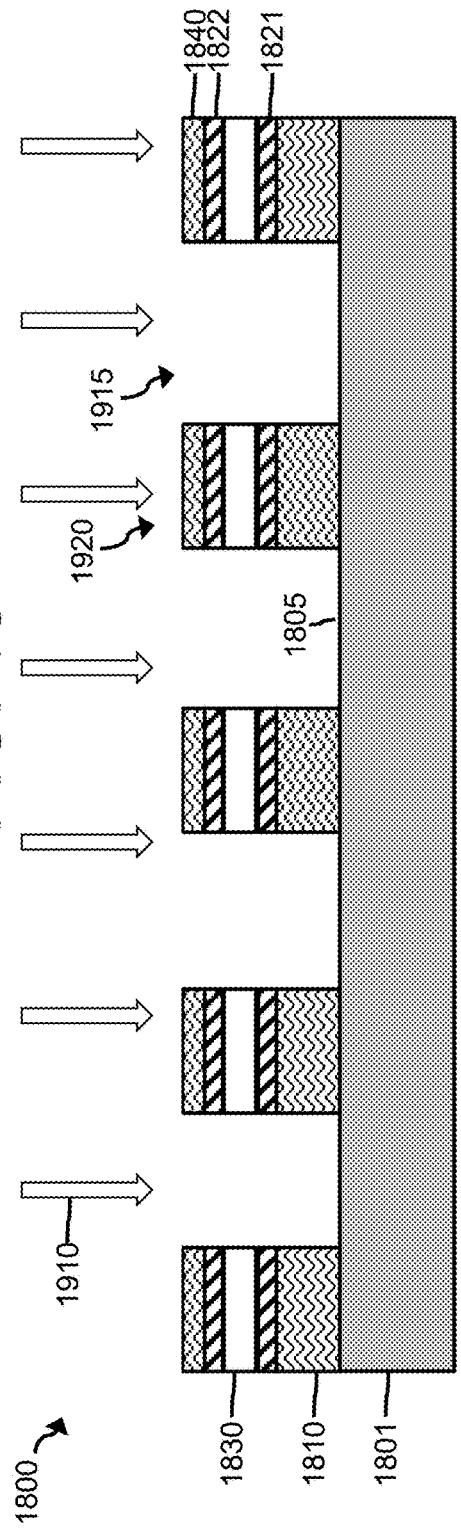

FIG. 19 is an example cross-sectional illustration of structure 1800 formed according to step 1792. The etching 1910 is illustrated by the arrows in FIG. 18. As result of the etching 1910, voids 1915 are formed between neighboring mesa structures 1920. The voids 1915 extend to an exposed surface 1805 of the substrate 1801. A portion of the patterned second insulator layer 1840 can be etched during the etching 1910. The cross-sectional thickness of the patterned second insulator layer 1840 is configured to be sufficient such that a portion of the patterned second insulator layer 1840 remains after etching 1910 to protect the second insulator layer 1822 and the underlying layers.

After the structure is etched in step 1792, the structure including the first patterned photo-imageable polymer layer is exposed to a solvent in step 1795. The first patterned photo-imageable polymer layer at least partially or fully dissolves in the solvent, which can release the structure deposited thereon as ferromagnetic film platelets. The released ferromagnetic film platelets can be the same as platelets 100, 300, and/or 1300. The solvent can comprise or consist of isopropyl alcohol, acetone, ethanol, toluene, and/or another solvent. The second patterned photo-imageable polymer layer can also dissolve in the solvent so that only the film layers of the ferromagnetic film platelets are released.

FIG. 20 illustrates a solvent 2000 introduced to the structure 1800 of FIG. 19. The mesa structures 1920 are preferably submerged in the solvent 2000 so that both the first and second patterned photo-imageable polymer layers 1810, 1840 are exposed to the solvent.

FIG. 21 is example cross-sectional illustration of structure 1800 of FIG. 20 after the first and second patterned photo-imageable polymer layers 1810, 1840 are dissolved and platelets 2100 are released. The released platelets 2100 can be collected to form a ferromagnetic polymer composite material (e.g., as in method 50). The released platelets 2100 can be collected with the solvent 2000 such as by decanting the solvent 2000 into a container. Alternatively, the released platelets 2100 can be collected in a filter when the solvent 2000 is removed (e.g., decanted). The released platelets 2100 can be the same as platelets 100, 300, and/or 1300. After the platelets 2100 are formed and collected, the substrate 1801 can be discarded (e.g., as in a sacrificial substrate), reworked or recycled (e.g., to form additional platelets), or used for another purpose.

Figure 22:
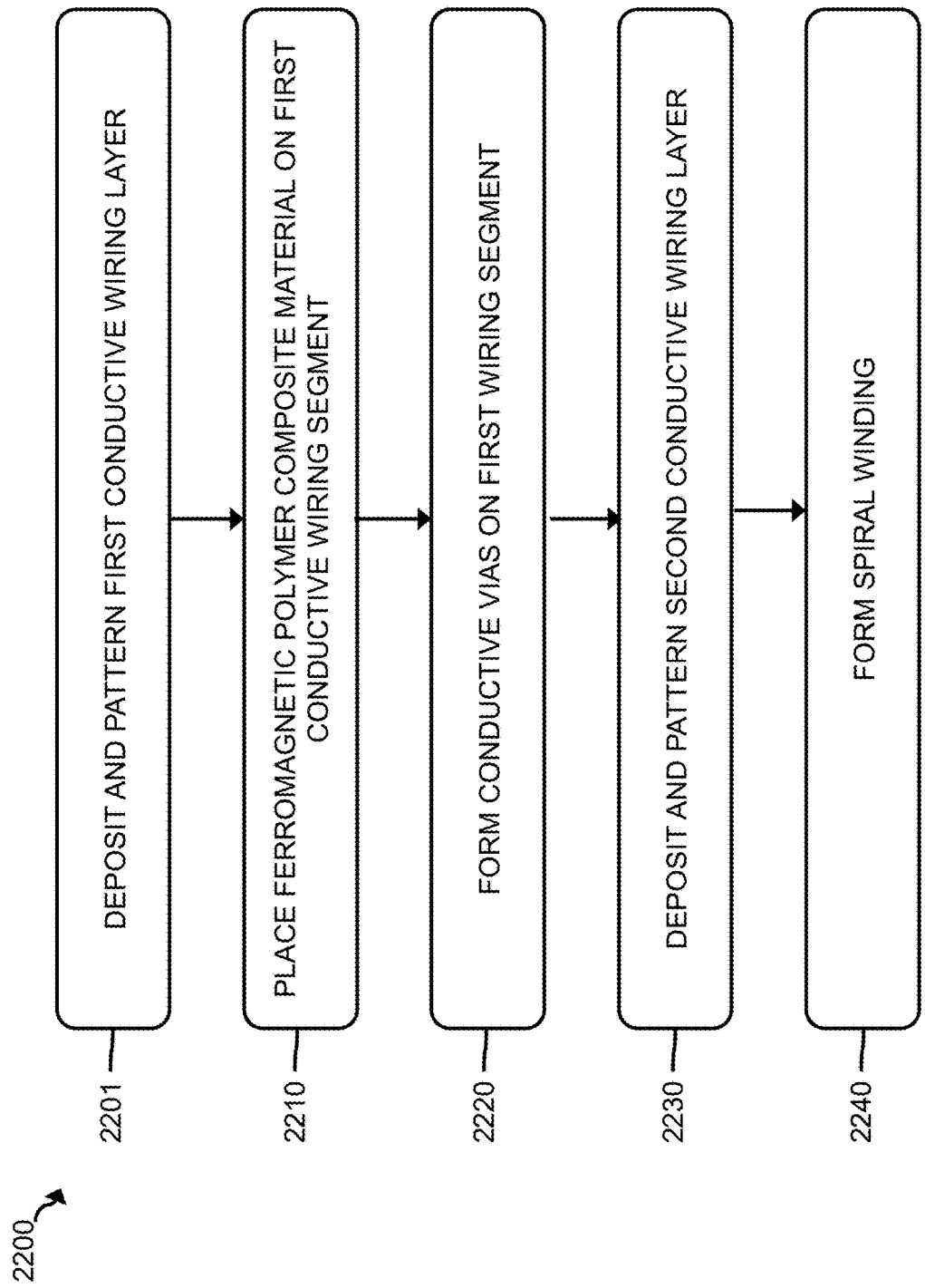
FIG. 22 is a flow chart of a method for manufacturing an inductor according to an embodiment.

FIG. 22 is a flow chart of a method 2200 for manufacturing an inductor according to an embodiment. In step 2201, a first conductive wiring layer is deposited on or over a substrate. When the first conductive wiring layer is deposited over the substrate, the first conductive wiring layer is deposited on an exposed layer, such as an insulator layer, that lies directly or indirectly on the substrate. The substrate can be a semiconductor substrate that can be suitable for semiconductor manufacturing. The semiconductor substrate can comprise or consist of silicon, a compound that includes silicon, or another substance. The first conductive wiring layer can comprise a metal such as copper, aluminum, or another conductive material or metal. The first conductive wiring layer is formed into one or more patterned wiring segments including a first patterned wiring segment. The patterned wiring segment(s) can be formed through patterning and etching the wiring segment (e.g., when the first conductive wiring layer comprises or consists of aluminum) or through a damascene or dual-damascene process e.g., when the first conductive wiring layer comprises or consists of copper). Patterning and etching the wiring segment can comprise depositing and patterning a photo-imageable polymer layer (e.g., a photoresist) on the first conductive wiring layer and then etching the first conductive wiring layer using the patterned photo-imageable polymer layer. The patterned photo-imageable polymer layer is removed after the first conductive wiring layer is patterned.

FIG. 23 is example cross-sectional illustration of a structure 2300 that includes a first patterned wiring segment 2310 formed on a substrate 2301 according to step 2201. In other embodiments, one or more layers of material can be disposed between the first patterned wiring segment 2310 and the substrate 2301. Substrate 2301 can be the same as substrate 1801 and/or 900.

In step 2210, a ferromagnetic polymer composite material is placed, disposed, and/or formed on the first conductive wiring layer segment formed in step 2201. The ferromagnetic polymer composite material can be cured prior to or after being placed and/or disposed on the first conductive wiring segment. In one example, the ferromagnetic polymer composite material is cured in a mold having predetermined dimensions and/or a predetermined shape to form the core of the inductor. In some embodiments, the ferromagnetic polymer composite material can be placed and/or arranged such that the easy and/or hard axes of magnetization in the ferromagnetic layer(s) of each ferromagnetic film platelet is aligned in a desired direction with respect to the inductor coil that is being formed. Thus, the core can comprise or consist of the ferromagnetic polymer composite material.

FIG. 24 is example cross-sectional illustration of structure 2300 formed according to step 2210 in which a cured ferromagnetic polymer composite material segment 2320 is disposed on the first patterned wiring segment 2310 formed on a substrate 2301. The cured ferromagnetic polymer composite material segment 2320 includes ferromagnetic film platelets 2330 having one or more ferromagnetic layers 2332. The platelets 2330 can be the same as platelets 100, 300, 1300, and/or 2100. The ferromagnetic layers 2332 can be magnetically anisotropic. For example, the ferromagnetic layers 2332 can have easy and hard axes of magnetization 2334, 2336 that are aligned in mutually orthogonal directions within the major plane of the respective ferromagnetic layer 2332. In addition, the easy and hard axes of magnetization 2334, 2336 in the platelets 2330 can be aligned in a common direction or orientation. For example, in FIG. 24 the hard axes of magnetization 2336 are aligned with each other and with a coil axis 2400 along which the inductor coil will extend.

In step 2220, conductive VIAs are formed on the first conductive wiring segment. The VIAs can be formed using known semiconductor manufacturing techniques. For example, the VIAs can be formed by patterning and etching an insulator layer to form voids and depositing a conductive material in the voids to form the VIAs. The conductive material can be deposited by physical vapor deposition and/or electrochemical deposition. The conductive material in the VIAs can be the same as the conductive material in the first conductive wiring layer. For example, the VIAs can comprise a metal such as copper, aluminum, or another conductive material or metal.

FIG. 25 is example cross-sectional illustration of structure 2300 formed according to step 2220 in which conductive VIAs 2340 are formed on the first patterned wiring segment 2310. The conductive VIAs 2340 are electrically coupled to the first patterned wiring segment 2310 for example by direct physical attachment. The conductive VIAs 2340 can be in direct physical contact with the cured ferromagnetic polymer composite material segment 2320. Alternatively, a spacer or insulator layer can be disposed between each VIA 2340 and the cured ferromagnetic polymer composite material segment 2320. The exposed surfaces of the VIAs 2340 and of the cured ferromagnetic polymer composite material segment 2320 forms a planar surface 2350 on which to deposit another material layer. In step 2230, a second conductive wiring layer is deposited on the VIAs and the cured ferromagnetic polymer composite material segment. The second conductive wiring layer is then patterned to form one or more patterned wiring segments including a second patterned wiring segment. The second patterned wiring segment is disposed on and electrically coupled to the VIAs formed in step 2220. The second patterned wiring segment is also disposed on the cured ferromagnetic polymer composite material segment. The second conductive wiring layer segment can be formed in the same manner as the first conductive wiring layer segment in step 2201.

In step 2240, the first and second conductive wiring segments and the conductive VIAs form an inductor coil that wraps around in a spiral or spiral-like manner around the cured ferromagnetic polymer composite material segment, which functions as the core of the inductor.

FIG. 26 is an example cross-sectional illustration of structure 2300 formed according to steps 2230 and 2240. A second patterned wiring segment 2360 is formed on the conductive VIAs 2340 and on the cured ferromagnetic polymer composite material segment 2320. The conductive VIAs 2340 are electrically coupled to the first and second patterned wiring segments 2310, 2360 to form an inductor coil 2600. The first and second patterned wiring segments 2310, 2360 can be in direct physical contact with the cured ferromagnetic polymer composite material segment 2320. Alternatively, a spacer or insulator layer can be disposed between the first patterned wiring segment 2310 and the cured ferromagnetic polymer composite material segment 2320 and/or between the second patterned wiring segment 2360 and the cured ferromagnetic polymer composite material segment 2320. The conductive VIAs are preferably in direct physical contact with the first and second patterned wiring segments 2310, 2360.

The inductor coil 2600 wraps around in a spiral or spiral-like manner around the cured ferromagnetic polymer composite material segment 2320, which functions as a core 2610, where structure 2300 is an inductor. The inductor coil 2600 extends along inductor axis 2400, which is parallel to the hard axes of magnetization 2336 of the platelets 2330 in the cured ferromagnetic polymer composite material segment 2320.

Figure 27:
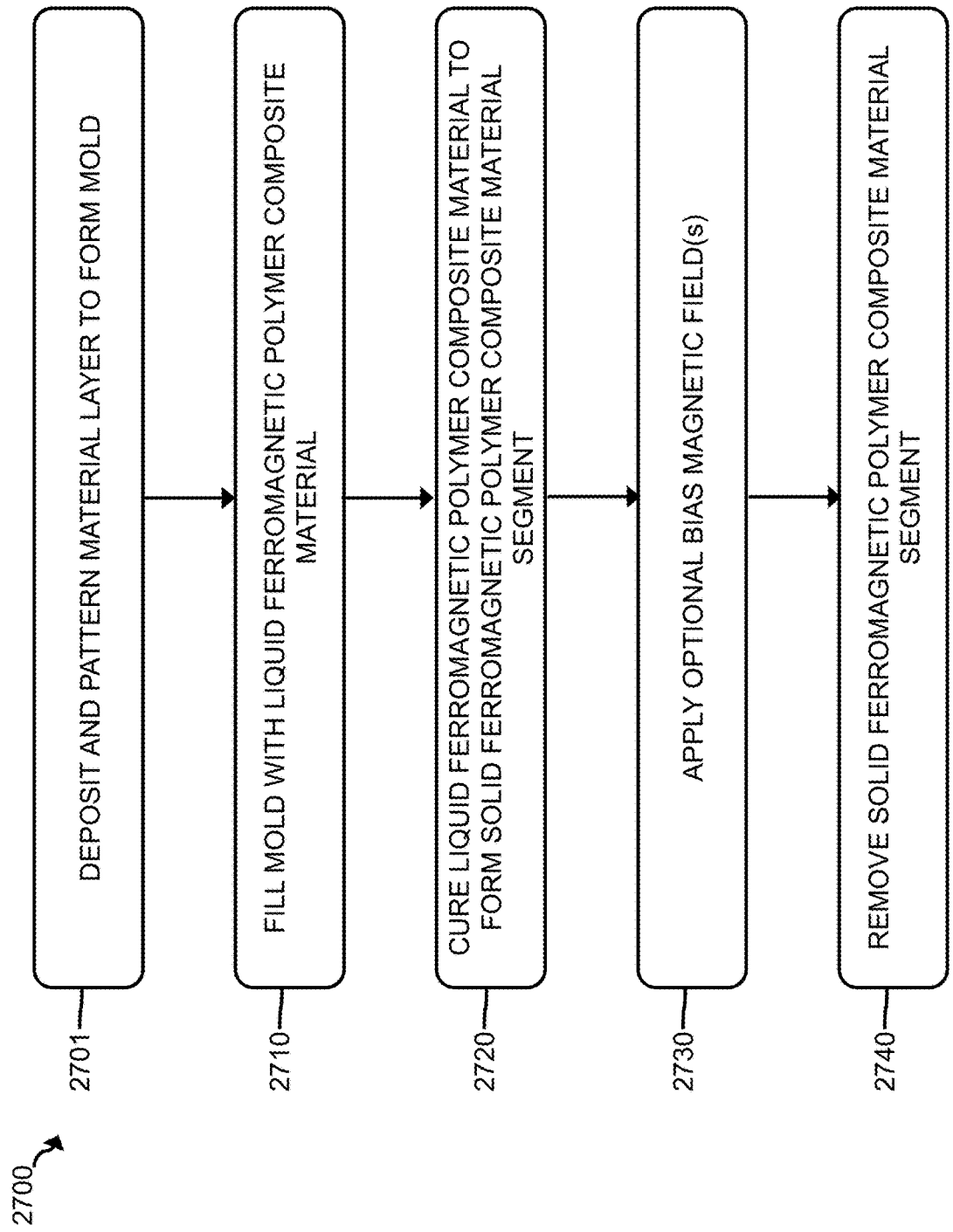
FIG. 27 is a flow chart of a method of molding a ferromagnetic polymer composite material according to an embodiment.

FIG. 27 is a flow chart of a method of molding a ferromagnetic polymer composite material according to an embodiment. In step 2701, a material layer is deposited and patterned on a substrate. The substrate can comprise a semiconductor substrate or another substrate which can be suitable for semiconductor manufacturing processes. The substrate has a planar surface on which to deposit materials. The material layer can comprise an insulator layer, a cured photo-imageable polymer layer, a metal layer, or another material layer such as silicone. The voided space defined by the pattern in the material layer can function as a mold.

FIG. 28 is an example cross-sectional illustration of a structure 2800 formed according to steps 2701. The structure 2800 includes a substrate 2801 and patterned material layer segments 2810. The patterned material layer segments 2810 define a cavity 2812 that is bounded by the substrate 2801 a mold 2814.

In step 2710, the mold is filled with liquid ferromagnetic polymer composite material. The liquid ferromagnetic polymer composite material can be applied through spin-coating, screen printing, injecting, and/or another fluid dispensation process or technique.

FIG. 29 is an example cross-sectional illustration of structure 2800 in which the mold 2814 is filled with a liquid ferromagnetic polymer composite material 2820.

In step 2720, the liquid ferromagnetic polymer composite material is cured to form a solid ferromagnetic polymer composite material segment. The liquid ferromagnetic polymer composite material can be cured by exposing the liquid ferromagnetic polymer composite material to a heat source, such as placing the mold in an oven or on a hot plate, placing the mold near a high-intensity lamp, exposing the liquid ferromagnetic polymer composite material to a laser or ultraviolet light, and/or or exposing the ferromagnetic polymer composite to ambient conditions for a controlled period of time. Step 2710 can be performed in the same manner as step 520.

In optional step 2730, one or more bias magnetic fields can be applied to the ferromagnetic polymer composite material. When the platelets are magnetically anisotropic, the bias magnetic field(s) can align the easy and/or hard axes of some or all of the platelets so that the overall composite material is magnetically anisotropic. The bias magnetic fields can be applied during the curing step 2720. The optional bias magnetic fields can be applied in the same as described with respect to step 530 and FIGS. 6 and 7. In the case when the magnetic field is applied during the curing process, and/or while the ferromagnetic polymer composite is still in its liquid form, the magnetic platelets will physically move within the solution to align with the applied fields. In the case when the magnetic field is applied after the polymer has cured, the combination of magnetic field, temperature and time can be applied to induce or re-align magnetic anisotropy within the platelets according to the applied magnetic field.

Figure 30:
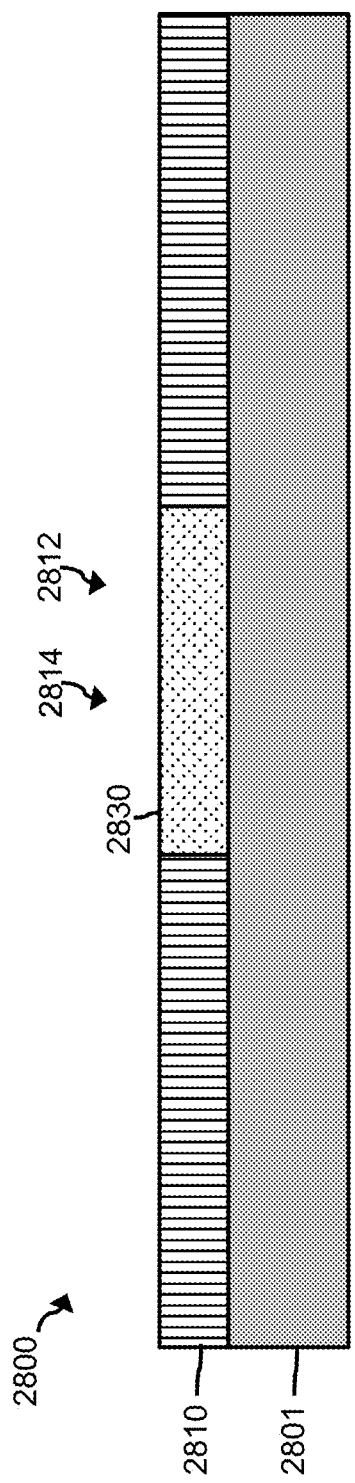

FIG. 30 is an example cross-sectional illustration of structure 2800 in which the liquid ferromagnetic polymer composite material 2820 has been cured to form a solid ferromagnetic polymer composite material segment 2830.

In step 2740, the solid ferromagnetic polymer composite material segment 2830 is removed from the mold. This can be accomplished by applying force to the back of the substrate 2801 to deform and expand the cavity 2812, then using gravity or magnetic attraction to pull the segment 2830 from the mold 2814. Alternatively, the patterned material layer segments 2810 can be removed from the substrate 2801 by peeling the segments 2810 off or dissolving them in a solvent or etchant. The segment 2830 can then be physically removed from the substrate 2801 or the segment 2830 can remain on the substrate 2801 for additional processing.

Figure 31:
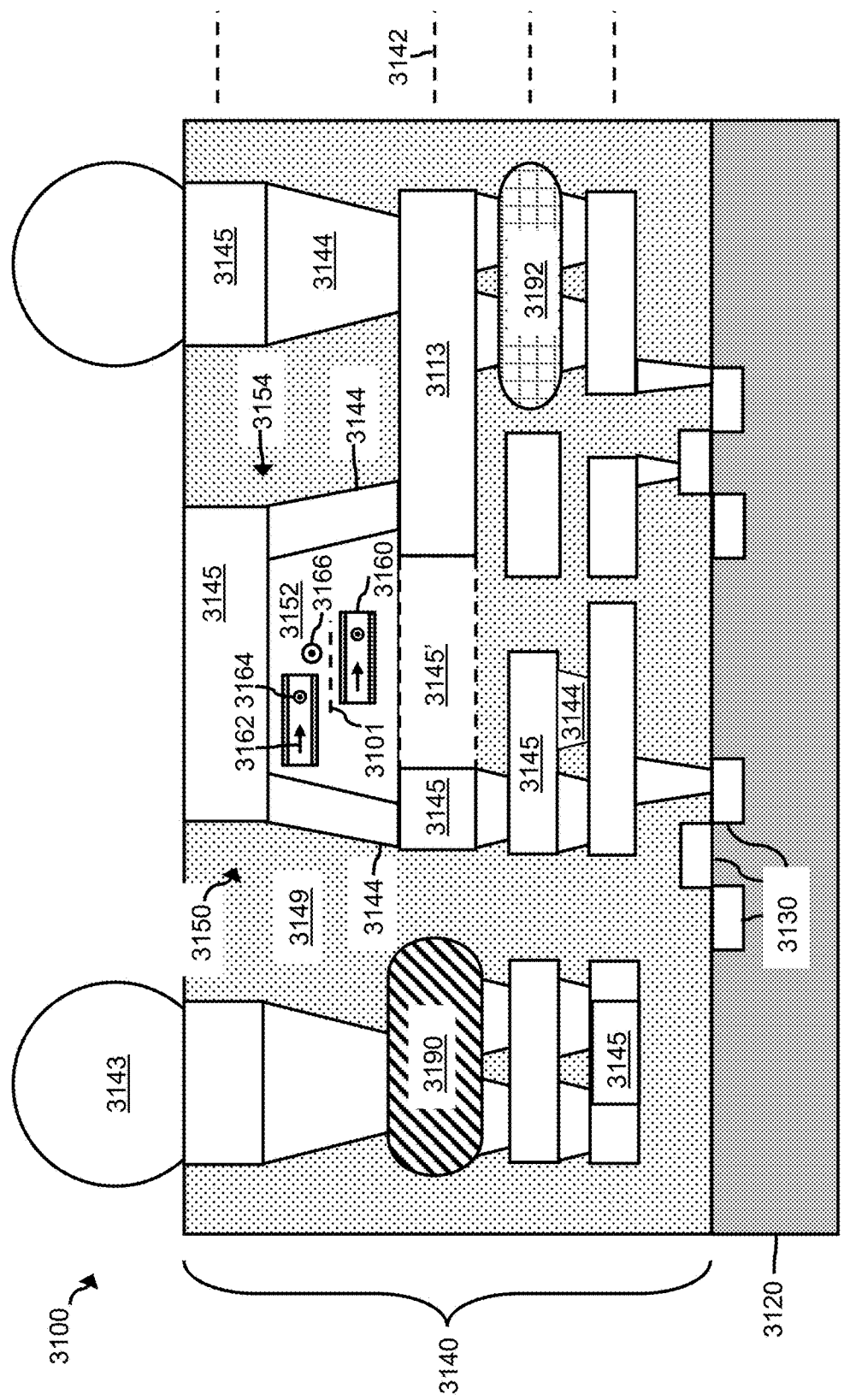
FIG. 31 is an example cross-sectional illustration of a multilevel wiring structure that includes an inductor having a ferromagnetic polymer composite material core according to an embodiment.

FIG. 31 is an example cross-sectional illustration of a multilevel wiring structure 3100 that includes an inductor having a ferromagnetic polymer composite material core according to an embodiment. The structure 3100 includes a multilevel wiring network 3140 having multiple wiring planes 3142. The multilevel wiring network 3140 is electrically coupled active circuit components 3130, such as CMOS devices or transistors, that have been fabricated on a semiconductor substrate 3120. The active circuit components 3130 can be any kind such as planar or three-dimensional transistors, FinFETs, or the like. The substrate 3120 can be a bulk, SOI, Si-based, or other semiconductor-based substrate, without limitation. Pertaining to the same die, and over the semiconductor substrate 3120 and the components 3130, the multilevel wiring network 3140 has been fabricated.

The multilevel wiring network 3140 is arranged into wiring planes 3142 and can include addition or fewer wiring planes than those illustrated in FIG. 31. Each wiring plane 3142 contains conductive wire segments 3145. Electrical connections between conducive wire segments 3145 of differing wiring planes 3142 are provided by conductive VIAs 3144. Also shown are typical IC chip contact structures 3143, usually referred to in the art as C4 contacts, solder bumps, or copper pillars, but any other contacts for the chip's external communication are acceptable without limitation. The spaces in the wiring network 3140 are typically filled with a dielectric insulating material 3149, of which quite a few are known in the art, such as $SiO_2$.

An inductor 3150 is integrated into the multilevel wiring network 3140. The inductor 3150 includes a core 3152 that is formed of ferromagnetic polymer composite material (e.g., a solid ferromagnetic polymer composite material core segment). The wiring segments 3145 are substantially parallel with the wiring planes 3142. The inductor 3150 further includes a conductive winding 3154 that forms a general spiral on the outside of the core 3152. The conductive winding 3154 is piecewise constructed of wire segments 3145 and of VIAs 3144. The wire segments 3145 forming the conductive winding 3154 are disposed in at least two of the wiring planes 3142 and the VIAs 3144 that form parts of the conductive winding 3154 that are vertical or orthogonal to a principal plane 3101 of the core 3152 interconnect the wire segments 3145 in the at least two wiring planes 3142. The wire segment 3145' underneath the core 3152 is delineated with dashed lines indicating that, depending how the conductive winding 3154 is constructed, it may not be visible in the depicted cross-sectional plane. A wire segment function as a lead 3113 to the conductive winding 3154 is also shown.

Inductor 3150 can be formed as described herein, for example as described with respect to FIGS. 22-30. For example, the ferromagnetic polymer composite material in core 3152 includes platelets 3160. The ferromagnetic layers in the platelets 3160 can be magnetically anisotropic such that the easy and hard axes of magnetization 3162, 3164 of the ferromagnetic layers are aligned in orthogonal directions with the principal plane of the respective ferromagnetic layers. The easy and hard axes of magnetization 3162, 3164 in the platelets 3160 can be aligned in a common direction or orientation. For example, in FIG. 31 the hard axes of magnetization 3164 are aligned with each other and with a coil axis 3166 along which the conductive winding 3154 extends.

One or more optional components, shown as representative structures 3190, 3192, can also be integrated into the multilevel wiring structure 3140. Each representative structure 3190, 3192 can include one or more capacitors (e.g., trench capacitors, MIM capacitors, etc.), resistors, transformers, diodes, and/or inductors. Such components, including inductor 3150, can be electrically coupled in series, in parallel, or a combination thereof, to one another.

The useful properties of the ferromagnetic composite material include a high permeability, low coercivity and low AC loss from eddy currents. These properties are advantageous for inductors, transformers, and antennae that are used in communications, signal processing, and power converter circuits.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. An inductor comprising:
   a core comprising:
     a polymer; and
     a plurality of ferromagnetic film platelets disposed in the polymer, each ferromagnetic film platelet comprising:
       first and second insulator layers; and
       a ferromagnetic layer disposed between the first and second insulator layers, the ferromagnetic layer comprising:
         a hard ferromagnetic layer having a magnetic coercivity of at least about 100 Oe; and
         a soft ferromagnetic layer having a magnetic coercivity of less than or equal to about 1 Oe,
         wherein the hard and soft ferromagnetic layers are magnetically coupled; and
   a conductive winding that turns around in a spiral manner on an outside of the core.

2. The inductor of claim 1, wherein in each ferromagnetic film platelet the ferromagnetic layer is in direct physical contact with the first and second insulator layers.

3. The inductor of claim 1, wherein in each ferromagnetic platelet:
   a plane passes through and parallel to an interface between the first insulator layer and the ferromagnetic layer, and
   the ferromagnetic layer has a magnetic anisotropy in which a hard axis of magnetization of the soft ferromagnetic layer is aligned parallel to the plane.

4. The inductor of claim 3, wherein the hard axes of magnetization in the soft ferromagnetic layer of each ferromagnetic film platelet are aligned with each other.

5. The inductor of claim 1, wherein in each ferromagnetic film platelet the hard ferromagnetic layer has a remnant magnetization of at least 0.1 T.

6. The inductor of claim 5, wherein in each ferromagnetic platelet:
   a plane passes through and parallel to an interface between the first insulator layer and the ferromagnetic layer,
   the hard ferromagnetic layer has a magnetic anisotropy in which an easy axis of magnetization of the hard ferromagnetic layer is aligned parallel to the plane,
   the soft ferromagnetic layer has a magnetic anisotropy in which an easy axis of magnetization of the soft ferromagnetic layer is aligned parallel to the plane, and
   the easy axis of magnetization of the soft ferromagnetic layer is parallel to the easy axis of magnetization of the hard ferromagnetic layer.

7. The inductor of claim 1, wherein the electrical insulators comprise a compound that includes (a) oxygen and/or nitrogen and (b) aluminum, chromium, cobalt, silicon, tantalum, titanium, silicon, and/or zirconium.

8. The inductor of claim 7, wherein the electrical insulators function as a diffusion barrier between the ferromagnetic layer and the polymer.

9. The inductor of claim 1, wherein:
   a plane passes through and parallel to an interface between the first insulator layer and the ferromagnetic layer,
   the ferromagnetic layer has a thickness in a range of about 100 nm to about 10 μm, the thickness measured along an axis orthogonal to the plane.

10. The inductor of claim 1, wherein:
    a plane passes through and parallel to an interface between the first insulator layer and the ferromagnetic layer,
    each film platelet has a thickness in a range of about 100 nm to about 10 μm, the thickness measured along an axis orthogonal to the plane,
    each film platelet has a width in a range of about 1 μm to about 100 μm, the width measured along a second axis that is orthogonal to the first axis, and
    each film platelet has a length in a range of about 1 μm to about 100 μm, the length measured along a third axis that is orthogonal to the first and second axes.

11. The inductor of claim 10, wherein each film platelet has a cross-sectional shape of an ellipse or a disk, the cross-sectional shape in a cross section parallel to the plane.

12. The inductor of claim 1, wherein the core comprises a range of about 40% to about 99% by volume of the ferromagnetic film platelets and about a range of about 1% to about 60% by volume of the polymer.

13. The inductor of claim 1, wherein the core consists of the polymer and the ferromagnetic film platelets.

14. A structure comprising:
    a semiconductor integrated circuit comprising a multilevel wiring network formed on a substrate,
    wherein the inductor of claim 1 is integrated into the multilevel wiring network.

15. An inductor comprising:
    a core comprising:
      a polymer; and
      a plurality of ferromagnetic film platelets disposed in the polymer, each ferromagnetic film platelet comprising:
        first and second insulator layers;
        a plurality of ferromagnetic layers disposed between the first and second insulator layers, the plurality of ferromagnetic layers including pairs of neighboring ferromagnetic layers; and
        a plurality of spacer layers, each spacer layer disposed between a respective pair of neighboring ferromagnetic layers;
    a conductive winding that turns around in a spiral manner on an outside of the core.

16. The inductor of claim 15, wherein each spacer layer functions as an electrical insulation layer.

17. The inductor of claim 15, wherein:
    a plane passes through an interface between the first insulator layer and an adjacent ferromagnetic layer,
    each ferromagnetic layer has a magnetic anisotropy in which a hard axis of magnetization of the ferromagnetic layer is aligned parallel to the plane, and
    the hard axes of magnetization are aligned.

18. The inductor of claim 17, wherein the hard axes of magnetization in the ferromagnetic film platelets are aligned.

19. The inductor of claim 15, wherein each pair of ferromagnetic layers comprises:
    a hard ferromagnetic layer having a magnetic coercivity of at least about 100 Oe; and
    a soft ferromagnetic layer having a magnetic coercivity of less than or equal to about 1 Oe.

20. The inductor of claim 19, wherein the hard and soft ferromagnetic layers of each pair of ferromagnetic layers are magnetically coupled.

21. The inductor of claim 19, wherein each hard ferromagnetic layer has a remnant magnetization of at least 0.1 T.

22. The inductor of claim 19, wherein:
a plane passes through an interface between the first insulator layer and an adjacent ferromagnetic layer,
a cross-sectional thickness of each hard ferromagnetic layer is measured with respect to an axis that is orthogonal to the plane,
a cross-sectional thickness of each soft ferromagnetic layer is measured with respect to the axis, and
a ratio of the cross-sectional thickness of each soft ferromagnetic layer to the cross-sectional thickness of each hard ferromagnetic layer of each pair of ferromagnetic layers is greater than or equal to 10 and less than or equal to 1,000.

23. The inductor of claim 15, wherein the core consists of the polymer and the ferromagnetic film platelets.

24. The inductor of claim 15, wherein each ferromagnetic layer comprises a soft ferromagnetic layer having a magnetic coercivity of less than or equal to about 1 Oe, wherein:
a plane passes through and parallel to an interface between the first insulator layer and a first ferromagnetic layer,
each soft ferromagnetic layer has a magnetic anisotropy in which an easy axis of magnetization is aligned parallel to the plane, and
the easy axes of magnetization of the soft ferromagnetic layers of each ferromagnetic film platelet are aligned with each other.

25. The inductor of claim 24, wherein:
each soft ferromagnetic layer has a hard axis of magnetization that is aligned parallel to the plane and orthogonal to the easy axis of magnetization, and
the hard axes of magnetization of the soft ferromagnetic layers of each ferromagnetic film platelet are aligned with each other.

26. A structure comprising:
a semiconductor integrated circuit comprising a multilevel wiring network formed on a substrate,
wherein the inductor of claim 15 is integrated into the multilevel wiring network.

* * * * *